United States Patent [19]
Yoshida

[11] Patent Number: 5,812,076
[45] Date of Patent: Sep. 22, 1998

[54] DATA COMPRESSING APPARATUS, DATA RESTORING APPARATUS AND RECORDING MEDIUM

[75] Inventor: Shigeru Yoshida, Kanagawa, Japan

[73] Assignee: Fujitsu Limited, Kawasaki, Japan

[21] Appl. No.: 748,033

[22] Filed: Nov. 12, 1996

[30] Foreign Application Priority Data

Mar. 26, 1996 [JP] Japan .................................. 8-070540

[51] Int. Cl.⁶ .............................................. H03M 7/30
[52] U.S. Cl. ............................................ 341/106; 341/50
[58] Field of Search .............................. 341/67, 65, 106, 341/50, 51, 63, 107

[56] References Cited

U.S. PATENT DOCUMENTS

| | | | |
|---|---|---|---|
| 5,045,852 | 9/1991 | Mitchell et al. | 341/51 |
| 5,357,250 | 10/1994 | Healey et al. | 341/107 |
| 5,381,145 | 1/1995 | Allen et al. | 341/107 |
| 5,574,449 | 11/1996 | Golin | 341/65 |
| 5,650,783 | 7/1997 | Murashita et al. | 341/107 |
| 5,710,562 | 1/1998 | Gormish et al. | 341/107 |
| 5,717,394 | 2/1998 | Schartz et al. | 341/51 |

*Primary Examiner*—Marc S. Hoff
*Assistant Examiner*—Peguy JeanPierre
*Attorney, Agent, or Firm*—Staas & Halsey

[57] ABSTRACT

A data compressing apparatus is capable of executing a data compression at a high speed and a high compression rate. A data restoring apparatus is used in combination with the data compressing apparatus. The data compressing apparatus incorporates code tables used for respective contexts and a device for determining whether the code table contains a character an occurrence probability of which exceeds 50%. If the character (MPS) with its occurrence probability of over 50% exists in a first code table when coding a certain character, the data compressing apparatus creates an extension code table in which respective codes are made corresponding to a character string of two characters starting with the MPS and to the respective characters excluding the MPS within the first code table based on the first code table and one other code table.

15 Claims, 17 Drawing Sheets

FIG. 11

| ORDER (CHARACTER) | CODE |
|---|---|
| I | 0 |
| II | 1 0 |
| III | 1 1 0 |
| IV | 1 1 1 0 |
| ⋮ | ⋮ |

(a)

| ORDER (CHARACTER) | CODE |
|---|---|
| α | 0 0 0 |
| β | 0 0 1 |
| γ | 0 1 0 |
| δ | 0 1 1 |
| ε | 1 0 0 0 |
| ζ | 1 0 0 1 |
| η | 1 0 1 0 |
| θ | 1 0 1 1 |
| ⋮ | ⋮ |

(b)

| ORDER (CHARACTER) | CODE |
|---|---|
| I α | 0 0 0 |
| I β | 0 0 1 |
| I γ | 0 1 0 |
| I δ | 0 1 1 |
| I ε | 1 0 0 0 0 |
| I ζ | 1 0 0 0 1 |
| I η | 1 0 0 1 0 |
| I θ | 1 0 0 1 1 |
| ⋮ | ⋮ |
| II | 1 1 0 |
| III | 1 1 1 0 |
| IV | 1 1 1 1 0 |
| ⋮ | ⋮ |

(c)

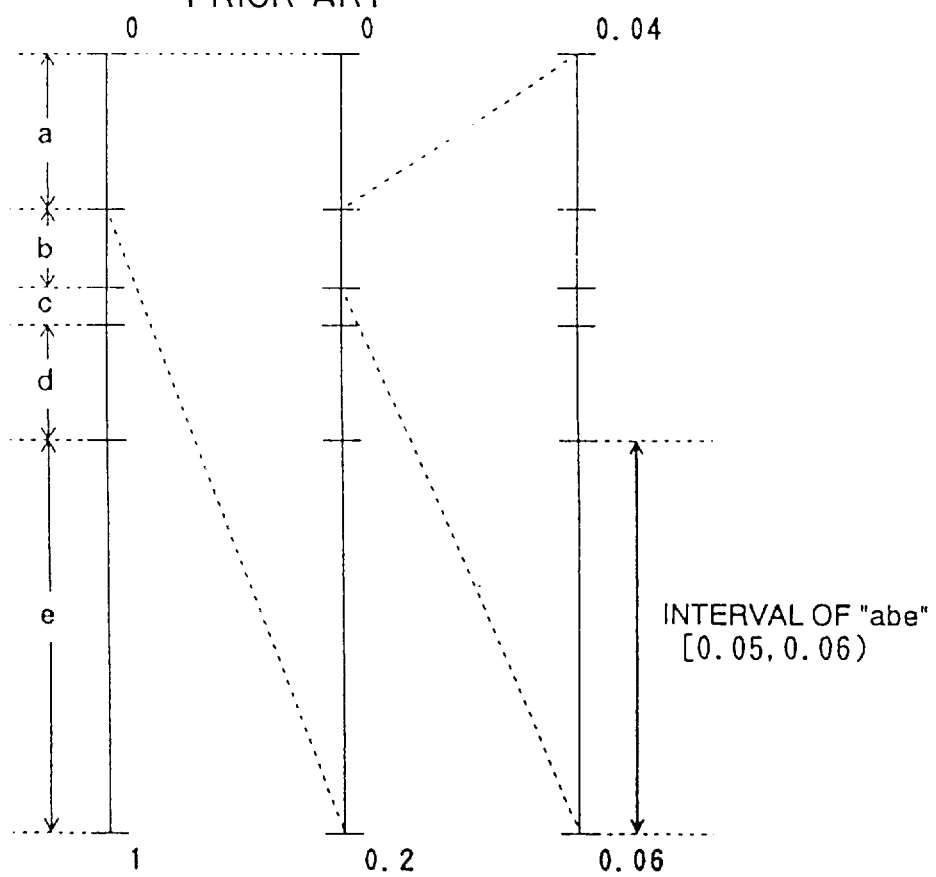

FIG. 22
PRIOR ART

| Gap x | Coding Method | | | | |
|---|---|---|---|---|---|
| | Unary | γ | δ | Golomb b=3 | b=6 |
| 1 | 0 | 0 | 0 | 00 | 000 |
| 2 | 10 | 100 | 1000 | 010 | 001 |
| 3 | 110 | 101 | 1001 | 011 | 0100 |
| 4 | 1110 | 11000 | 10100 | 100 | 0101 |
| 5 | 11110 | 11001 | 10101 | 1010 | 0110 |
| 6 | 111110 | 11010 | 10110 | 1011 | 0111 |
| 7 | 1111110 | 11011 | 10111 | 1100 | 1000 |
| 8 | 11111110 | 1110000 | 11000000 | 11010 | 1001 |
| 9 | 111111110 | 1110001 | 11000001 | 11011 | 10100 |
| 10 | 1111111110 | 1110010 | 11000010 | 11100 | 10101 |

DATA COMPRESSING APPARATUS, DATA RESTORING APPARATUS AND RECORDING MEDIUM

BACKGROUND OF THE INVENTION

1. Field of the Invention

The present invention relates to a data compressing apparatus for compressing data in a variety of forms, a data restoring apparatus for restoring the compressed data, and a recording medium recorded with a program for making a computer function as a data compressing apparatus or a data restoring apparatus.

2. Description of the Related Art

With a rapid advancement of computers in recent years, the computer deals with a large quantity of data, and it is practiced that the data are compressed for reducing a data transmitting time and for efficiently employing a storage device.

A data compressing method is classified into a method in which contents of the data to be compressed are limited and a content non-limited method. The latter non-limited compressing method is known as a universal compressing method. According to the universal compressing method, various kinds of data such as character codes, vector information and images can be compressed, and therefore, in the following discussion, one unit of data is termed a "character", and a plurality of characters connected are termed a "character string".

The universal compressing method is roughly classified into a dictionary type compressing method and a statistical type compressing method. The dictionary type compressing method of these methods is a method which makes use of similarities of the data and is called Lempel-Ziv coding. According to the dictionary type compressing method, a repetition of the character string is detected by comparing an inputted character string with a character string that was processed in the past, and the data are thereby compressed. With the data compression based on this method, it is feasible to attain a practical processing speed even when actualized by software on a personal computer, and hence this data compression is on the increasing utilization.

While on the other hand, according to the statistical type compressing method, the characters are variable-length-coded one by one in accordance with an occurrence probability of the character in the data. A prior art statistical type compressing method will be specifically explained with reference to FIGS. 17 through 22.

As shown in FIG. 17, the data compressing apparatus for executing the statistical type compression (coding) is constructed of a statistic model unit 31 and an entropy coding unit 32.

The statistic model unit 31 takes in a character that should be compressed and a character string (context) just anterior thereto, and calculates an occurrence probability (conditional probability) of the character according to the context that occurs just anterior thereto. For example, as schematically illustrated in FIG. 18, when original data consisting of characters arranged in a sequence such as "abc" is inputted, the statistic model unit 31 calculates a conditional probability P (c/ab) at which "c" defined as a coding target character occurs subsequent to "ab" defined as a context.

Known units as the statistic model unit 31 involve the use of a fixed degree context in which a degree of the context takes a fixed value and a blending context in which a degree of the context is not fixed. The statistic model unit 31 using the fixed degree context collects pieces of data about all the contexts of an Nth-degree and calculates the conditional probability at which each character occurs subsequent to each of the contexts.

Generally, when aiming at the data with a strong correlation between the characters, it is possible to obtain a higher compression rate by using a higher-degree context. In the case of aiming at the data with a weak correlation between the characters, it may happen that the compression rate decreases on the contrary when using the higher-degree context.

The blending context is defined as a technique contrived to obviate the above problem. The statistic model unit 31 using the blending context collects the contexts by using a tree structure as illustrated in FIG. 18. Then, if a certain context often occurs, a degree relative to this context is increased. If a certain context does not often occur, a degree remains low. Thus, the degree of each context is changed while adapting itself to the input data.

The entropy coding unit 32 allocates to the respective characters the codes dynamically created based on the occurrence probabilities obtained by the statistic model unit 31. Known units as the entropy coding unit 32 are those for executing dynamic Huffman coding and spray coding and those for effecting arithmetic coding and static coding.

In the entropy coding unit 32 using the arithmetic coding, a number line (hereinafter expressed such as $[0, 1)$) that is over 0 but less than 1 is sequentially narrowed in accordance with the occurrence probabilities (occurrence frequencies) of the respective characters constituting the data that should be encoded. Then, when the processes for all the characters are finished, a numerical value representing one point within the narrowed interval is outputted as a code.

For example, supposing that the coding target characters are five characters such as a, b, c, d and e, and that the occurrence probabilities of these characters are respectively 0,2, 0.1, 0.05, 0.15 and 0.5, as shown in FIG. 20, an interval having an interval width corresponding to the occurrence probability is given to each character.

Then, if the character string to be coded is assumed to be "abc", as schematically shown in FIG. 21, to begin with, the interval $[0, 1)$ is narrowed down to an interval $[0, 0.2)$ for the character "a". Subsequently, the interval $[0, 0.2)$ is segmented into intervals corresponding to the occurrence probabilities of the respective characters, and an interval $[0.04, 0.06)$ corresponding to the next character "b" is selected as an interval for a character string "ab". The interval $[0.04, 0.06)$ is further segmented into intervals corresponding to the occurrence probabilities of the individual characters, and an interval $[0.05, 0.06)$ corresponding to the next character "e" us selected as an interval for a character string "abe". Thereafter, a bit string under a decimal point when a position of an arbitrary point (e.g., a lower limit) within that interval is binary-indicated is outputted as a coded result.

A characteristic of the arithmetic coding is that a code under 1 bit can be allocated to one character. According to the arithmetic coding, it is possible to obtain a compression rate that is most approximate to a theoretical limit among the existing variable length coding methods. A particularly high compression rate can be attained by combining the arithmetic coding with the blending context. Note that the compression method with the combination of the blending context with the arithmetic coding is written in "Data Compression Using Adaptive Coding and Partial String Matching" (JOHN G. CLEARY et al. IEEE Trans. on Commu., Vol. COM-32 No. 4 APRIL 1984).

The arithmetic coding, however, has a large arithmetic quantity and therefore has such a defect that the processing is time-consuming. Under such circumstances, there is also reported a static coding method (compression method) to speed up the processing. A compression method with a combination of a fixed 1st-degree context with the static coding is written in, e.g., "Data Compression Apparatus and Method" (U.S. Pat. No. 4,612,532). Further, a compression method with a combination of a plurality of fixed contexts (e.g., 1st- and 3rd-degrees) with the static coding is written in "Dependency Data Compression with Self-organizing List" (Information Processing Association Journal Col. 35, No. 6 Jun. 1994). Based on those compression methods, the characters connected to the respective contexts are arranged according to occurrence frequencies thereof, and codes corresponding to the orders of the input characters within a static code table are outputted. Note that a γcode and a δcode shown in FIG. 22 are used as static codes in the latter compression method.

As explained above, the arithmetic coding is incapable of obtaining the practical processing speed. Therefore, in the case of requiring the high-speed processing, the static coding or the dynamic coding (dynamic Huffman code and spray code) is available. If a higher-degree (2nd or higher degree) context is applied for obtaining a high compression rate, however, it follows that there appear characters exhibiting an occurrence probability of over 50% with respect to some contexts, and the compression rate is not so enhanced. That is, according to those coding methods, the code under 1 bit can not be allocated unlike the arithmetic coding, and hence there is decreased a coding efficiency when using the context including the character with the occurrence probability of over 50% (the coding can be done under 1 bit).

A common practice of the information theory for compensating a fraction bit when performing the above bitwise coding is that the code is allocated to each set of plural characters (this operation is called an expansion of the information source) to thereby reduce the number of quantization bits per character. The compression rate can be certainly enhanced by expanding the information source. However, it may follow that the processing speed decreases depending on the procedure thereof.

SUMMARY OF THE INVENTION

It is a primary object of the present invention to provide a data compressing apparatus capable of attaining a high compression rate at a practical processing speed.

It is another object of the present invention to provide a data restoring apparatus capable of restoring the data compressed by the data compressing apparatus.

A first data compressing apparatus comprises a code table storing unit, an obtaining unit, a context specifying unit, a first coding unit and a second coding unit.

The code table storing unit is stored with a plurality of code tables, in which characters are made corresponding to codes, each related to a different context. The obtaining unit obtains a coding target character to be coded, from a character string that should be compressed. The context specifying unit specifies a context occurred just anterior to the coding target character obtained by the obtaining unit.

The first coding unit, if the code table stored in the code table storing unit with respect to a context specified by the context specifying unit is a code table containing a character an occurrence probability of which exceeds 50%, creates an extension code table in which the codes are made corresponding to a character string consisting of two characters start with the character with its occurrence probability of over 50% and a character excluding the character with its occurrence probability of over 50% by modifying the above code table. Then, the first coding unit codes the character string consisting of the coding target character, or the coding target character and a character next thereto, by use of the created extension code table. The second coding unit, if the code table stored in the code table storing unit with respect to the context specified by the context specifying unit is the code table containing no character with its occurrence probability of over 50%, codes the coding target character by use of this code table.

That is, according to the first data compressing apparatus of the present invention, if the character having the occurrence probability of over 50% is contained in the code table used for coding the coding target character, the code is allocated to the character string consisting of the coding target character and one other character (the information source is expanded), and the coding target character is thereby coded. On this occasion, the information source is expanded based on a combination of two code tables, and therefore the first data compressing apparatus is capable of compressing the data at the high speed and high compression rate.

A second data compressing apparatus according to the present invention comprises a code table storing unit, an obtaining unit, a context specifying unit, a determining unit, a code outputting unit, an extension code table creating unit, an extension code outputting unit and an updating unit.

The code table storing unit is stored with a plurality of code tables, in which characters are made corresponding to codes, each related to a different context. The obtaining unit obtains a coding target character to be coded, from a character string that should be compressed. The context specifying unit specifies a context occurred just anterior to the coding target character obtained by the obtaining unit. The determining unit determines whether an occurrence probability of a most frequently occurred character, i.e., the character exhibiting the highest occurrence probability among the characters within the code table stored in the code table storing unit with respect to the context specified by the context specifying unit, exceeds 50% or not.

The code outputting unit, when the determining unit determines that the occurrence probability of the most frequently occurred character does not exceed 50%, outputs a code made corresponding to the coding target character in the code table relative to the context that is stored in the code table storing unit.

The extension code table creating unit, when the determining unit determines that the occurrence probability of the most frequently occurred character exceeds 50%, sets one code table stored in the code table storing unit as a first code table, and creates an extension code table structured such that the codes are made corresponding to a character string in which each character within the first code table is subsequent to the most frequently occurred character in a second code table and to each character excluding the most frequently occurred character in the second code table on the basis of the first code table and the second code table for the context specified by the context specifying unit. The extension code outputting unit, when the extension code table creating unit creates the extension code table, outputs the code made corresponding to the coding target character in the extension code table if the coding target character is not the most frequently occurred character in the second code table, obtains a character that should be coded next if the coding target character is the most frequently occurred character in the second code table, and outputs the code made corresponding to a character string consisting of the coding target character and the obtained character in the extension code table.

The updating unit, when the code outputting unit or the extension code outputting unit outputs the code for the coding target character, updates a content of the code table relative to the context specified by the context specifying unit so that a code with a shorter code length is made corresponding to a character exhibiting a larger occurrence probability.

That is to say, according to the second data compressing apparatus of the present invention, the coding is dynamically executed. Then, if the character having the occurrence probability of over 50% is contained in the code table used for coding the coding target character, the code is allocated to the character string consisting of the coding target character and one other character (the information source is expanded), and the coding target character is thereby coded. Hence, the second data compressing apparatus is capable of compressing the data at the high speed and high compression rate.

The extension code table creating unit that may be adopted in the second data compressing apparatus according to the present invention, when creating the extension code table, uses, as a code for the character string starting with the most frequently occurred character, the code in which the head bit of the code, in the firs code table, made corresponding to a character subsequent to the most frequently occurred character within the character string, is substituted into one of "0" and "10" in accordance with a value of the head bit, and uses, as a code for the character exclusive of the most frequently occurred character in the second code table, a code in which the head bit of the code made corresponding to the character in the second table is substituted into "11".

Further, when constructing the second data compressing apparatus, there may be adopted the code table creating unit in which the data for substituting the head bit of the code in the first code table involves the use of "0" or "11", and the data for substituting the head bit of the code in the second code table involves the use of "10". Moreover, there may also be adopted the code table creating unit using "1" or "00" as the data for substituting the head bit of the code in the first code table, and using "01" as the data for substituting the head bit of the code in the second code table, and further the code table creating unit using "1" or "0" as the former data and using "00" as the latter data.

A third data compressing apparatus according to the present invention comprises a code table storing unit, a determining data storing unit, an obtaining unit, a context specifying unit, a determining unit, a code outputting unit, an extension code table creating unit, an extension code outputting unit and an updating unit.

The code table storing unit is stored with a plurality of code tables, in which characters are made corresponding to codes, each related to a different context. The determining data storing unit is stored with plural pieces of determining data in relation to contexts. The obtaining unit obtains a coding target character to be coded, from a character string that should be compressed. The context specifying unit specifies a context occurred just anterior to the coding target character obtained by the obtaining unit. The determining unit determines whether an occurrence probability of a most frequently occurred character defined as a character to which a 1-bit code is made corresponding in the code table relative to a context specified by the context specifying unit on the basis of determining data stored in the determining data storing unit with respect to the specified context, exceeds 50% or not. The code outputting unit, when the determining unit determines that the occurrence probability of the most frequently occurred character does not exceed 50%, outputs a code made corresponding to the coding target character in the code table relative to the context specified by the context specifying unit that is stored in the code table storing unit.

The extension code table creating unit, when the determining unit determines that the occurrence probability of the most frequently occurred character exceeds 50%, sets one of the code tables stored in the code table storing unit as a first code table, and creates an extension code table structured such that the codes are made corresponding to a character string in which each character within the first code table is subsequent to the most frequently occurred character in a second code table and to each character excluding the most frequently occurred character in the second code table on the basis of the first code table and the second code table related to the context specified by the context specifying unit. The extension code outputting unit, when the extension code table creating unit creates the extension code table, outputs the code made corresponding to the coding target character in the extension code table if the coding target character is not the most frequently occurred character in the second code table, obtains a character that should be coded next if the coding target character is the most frequently occurred character in the second code table, and outputs the code made corresponding to a character string consisting of the coding target character and the obtained character in the extension code table. The updating unit, when the code outputting unit or the extension code outputting unit outputs the code, updates a content of the determining data within the determining data storing unit with respect to the context specified by the context specifying unit, depending on whether or not the coding target character is coincident with the most frequently occurred character in the code table related to the context specified by the context specifying unit.

According to the third data compressing apparatus also, if the character having the occurrence probability of over 50% is contained in the code table used for coding the coding target character, the code is allocated to the character string consisting of the coding target character and one other character (the information source is expanded), and the coding target character is thereby coded. Therefore, the third data compressing apparatus is capable of compressing the data at the high speed and high compression rate.

The determining data storing unit in the third data compressing apparatus of the present invention may be stored with numerical value data as determining data. In this case, the determining unit is constructed to determine, if the determining data is larger than a predetermined fiducial value, that the occurrence probability of the most frequently occurred character exceeds 50%. Further, the updating unit is constructed to, if the coding target character is coincident with the most frequently occurred character, add a predetermined value to the determining data but, if the coding target character is not coincident with the most frequently occurred character, subtract the predetermined value from the determining data.

Moreover, in the third data compressing apparatus of the present invention, the determining data storing unit may be constructed of a plurality of shift registers each related to the context. In this case, the determining unit, if the shift register relative to the context specified by the context specifying unit contains "1" the number of which is larger than the predetermined fiducial value, determines that the occurrence probability of the most frequently occurred character exceeds 50%. Further, the updating unit, if the coding target character is coincident with the most frequently occurred character, inputs "1", from one end thereof, to the shift register corresponding to the context specified by the context specifying unit and shifts, by one bit, a content of the shift register toward the other end thereof, and, whereas if the coding target character is not coincident with the most frequently occurred character, inputs "0", from the other end thereof, to the shift register corresponding to the context specified by the context specifying unit and shifts, by one bit, the content of the shift register toward one end thereof.

A first data restoring apparatus according to the present invention comprises a code table storing unit, a context specifying unit, a first decoding unit and a second decoding unit.

The code table storing unit is stored with a plurality of code tables, in which characters are made corresponding to codes, each related to a different context. The context specifying unit specifies a context used for decoding the code. The first decoding unit, if the code table stored in the code table storing unit with respect to the context specified by the context specifying unit is a code table containing a character an occurrence probability of which exceeds 50%, modifies the code table to thereby create an extension code table in which codes are made corresponding to a character string comprising two characters starting from the character with its occurrence probability of over 50% and the character the occurrence probability of which does not exceed 50%. Then, the first decoding unit decodes the code the should be decoded by use of the thus created extension code table. The second decoding unit, if the code table stored in the code table storing unit with respect to the context specified by the context specifying unit is a code table containing no character with its occurrence probability of over 50%, decodes the code that should be decoded by use of the code table.

The first data restoring apparatus restores the data compressed by the first data compressing apparatus.

A second data restoring apparatus of the present invention comprises a code table storing unit, a context specifying unit, determining unit, a character outputting unit, an extension code table creating unit, a character/character string outputting unit and an updating unit.

The code table storing unit is stored with a plurality of code tables, in which characters are made corresponding to codes, each related to a different context. The context specifying unit specifies a context used for decoding the code. The determining unit determines whether an occurrence probability of a most frequently occurred character exhibiting a highest occurrent probability among characters within the code tables stored in the code table storing unit with respect to the context specified by the context specifying unit, exceeds 50% or not.

The character outputting unit, if the determining unit determines that the occurrence probability of the most frequently occurred character does not exceed 50%, outputs the character made corresponding to a code that should be decoded in the code table stored in the code table storing unit with respect to the context specified by the context specifying unit. The extension code table creating unit, when the determining unit determines that the occurrence probability of the lost frequently occurred character exceeds 50%, sets one code table stored in the code table storing unit as a first code table, and creates an extension code table structured such that the codes are made corresponding to a character string in which each character within the first code table is subsequent to the most frequently occurred character in a second code table and to each character excluding the most frequently occurred character in the second code table on the basis of the first code table and the second code table relative to the context specified by the context specifying unit. The character/character string outputting unit outputs a character or a character string made corresponding to the code that should be decoded in the extension code table created by the extension code table creating unit.

The updating unit, when the character outputting unit or the character/character string outputting unit outputs the character or the character string, updates a content of the code table relative to the context specified by the context specifying unit so that a code having a shorter code length is made corresponding to a character having a larger occurrence probability.

The second data restoring apparatus restores the data compressed by the second data compressing apparatus.

In the case of constructing the second data restoring apparatus, the extension code table creating unit, when creating the extension code table, uses, as a code for the character string starting with the most frequently occurred character, the code in which the head bit of the code, in the firs code table, made corresponding to a character subsequent to the most frequently occurred character within the character string, is substituted into "0" or "10" in accordance with a value of the head bit, and uses, as a code for the character exclusive of the most frequently occurred character in the second code table, a code in which the head bit of the code made corresponding to the character in the second table is substituted into "11".

A third data restoring apparatus of the present invention comprises a code table storing unit. a determining data storing unit, a context specifying unit, a determining unit, a character outputting unit, an extension code table creating unit, a character/character string outputting unit and an updating unit.

The code table storing unit is stored with a plurality of code tables, in which characters are made corresponding to codes, each related to a different context. The determining data storing unit is stored with plural pieces of determining data while being related to the contexts. The context specifying unit specifies a context used for decoding the code. The determining unit determines whether an occurrence probability of a most frequently occurred character defined as a character to which a 1-bit code is made corresponding in the code table related to a context specified by the context specifying unit on the basis of determining data stored in the determining data storing unit with respect to the specified context, exceeds 50% or not.

The character outputting unit, when the determining unit determines that the occurrence probability of the most frequently occurred character does not exceed 50%, outputs a character made corresponding to the code that should be decoded in the code table relative to the context specified by the context specifying unit that is stored in the code table storing unit. The extension code table creating unit, when the determining unit determines that the occurrence probability of the most frequently occurred character exceeds 50%, sets one code table stored in the code table storing unit as a first code table, and creates an extension code table structured such that the codes are made corresponding to a character string in which each character within the first code table is subsequent to the most frequently occurred character in a second code table and to each character excluding the most frequently occurred character in the second code table on the basis of the first code table and the second code table for the context specified by the context specifying unit. The character/character string outputting unit outputs a character or a character string made corresponding to the code that should be decoded in the extension code table created by the extension code table creating unit.

The updating unit, when the character outputting unit or the character/character string outputting unit outputs the character or the character string, updates a content of the determining data, related to the context specified by the context specifying unit, in the determining data storing unit, depending on whether or not the above character or the head character of the character string is coincident with the most frequently occurred character in the code table for the context specified by the context specifying unit.

The third data restoring apparatus restores the data compressed by the third data compressing apparatus.

In the third data restoring apparatus according to the present invention, the determining data storing unit is stored with the determining data defined as numerical value data. In the case of adopting the above determining data storing unit, the determining unit, if the determining data is larger than a predetermined fiducial value, determines that the occurrence probability of the most frequently occurred character exceeds 50%. Further, the updating unit, if the outputted character or the head character of the outputted character string is coincident with the most frequently occurred character, adds a predetermined value to the determining data and, in cases other than the above-mentioned, subtracts the predetermined value from the determining data.

Moreover, in the third data restoring apparatus according to the present invention, the determining data storing unit is constructed of a plurality of shift registers each related to the context. In this case, the determining unit, if the shift register corresponding to the context specified by the context specifying unit contains "1" the number of which is larger than the predetermined fiducial value, determines that the occurrence probability of the most frequently occurred character exceeds 50%. Further, the updating unit, if the outputted character or the head character of the outputted character string is coincident with the most frequently occurred character, inputs "1", from one end thereof, to the shift register corresponding to the context specified by the context specifying unit, shifts, by one bit, a content of the shift register toward the other end thereof, and, in cases other than the above-mentioned, inputs "0", from the other end thereof, to the shift register corresponding to the context specified by the context specifying unit and shifts, by one bit, the content of the shift register toward one end thereof.

BRIEF DESCRIPTION OF THE DRAWINGS

Other objects and advantages of the present invention will become apparent during the following discussion in conjunction with the accompanying drawings, in which:

FIG. 11 is a diagram showing two code tables used for coding in the data compressing apparatus in the second embodiment, and an extension code table created from these code tables;

FIG. 20 is a diagram showing a corresponding relationship between intervals and character occurrence probabilities in the case of arithmetic coding;

FIG. 21 is an explanatory diagram showing a coding procedure in the arithmetic coding; and FIG. 22 is a diagram showing a static code used when compressing the data.

DETAILED DESCRIPTION OF THE PREFERRED EMBODIMENTS

The present invention will hereinafter be specifically described with reference to the accompanying drawings.

First Embodiment

<Data Compressing Apparatus>

Figure 1:
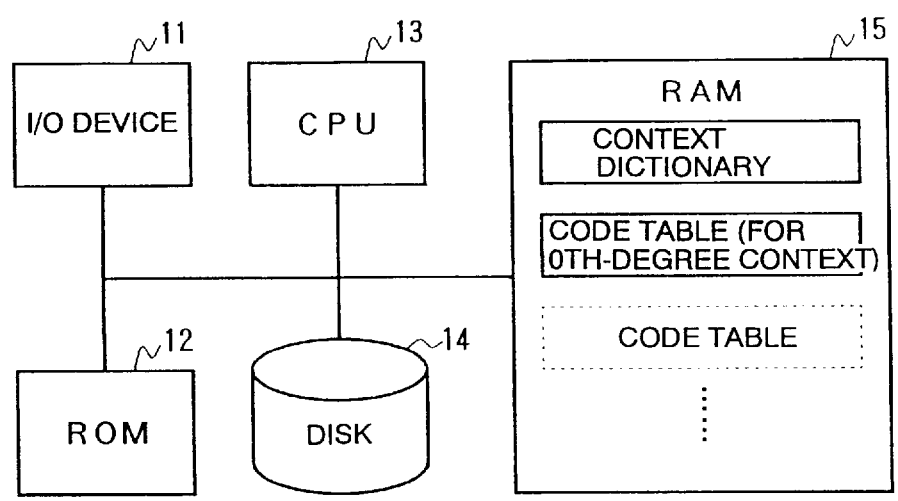
FIG. 1 is a block diagram showing a construction of a data compressing apparatus in a first embodiment of the present invention.

FIG. 1 shows a construction of a data compressing apparatus in a first embodiment. As illustrated in FIG. 1, the data compressing apparatus in the first embodiment includes, as principal components, an I/O unit 11, a ROM (Read-Only Memory) 12, a CPU (Central Processing Unit) 13, a disk storage device 14 and a RAM (Random Access memory) 15.

The I/O unit 11 is constructed of a keyboard, a CRT (Cathode Ray Tube) and peripheral units thereof, and is used for indicating data to be compressed. The ROM 12 is stored with a bootstrap loader. The disk storage device 14 is stored with an operating system and a data compression program. Further, the disk storage device 14 is also stored with data (files) for executing the compression.

The CPU 13 is a control circuit for controlling the respective units in an integrative manner. The CPU 13, upon switching ON a power supply, reads out and downloads the operating system stored in the disk storage device 14 into a predetermined storage area of the RAM 15 in accordance with the program within the ROM 12. Then, the CPU 13, upon inputting a predetermined indication from the I/O unit 11, reads a data compression program operating on the operating system out of the disk storage unit 14 and downloads other storage area of the RAM 15. Subsequently, the CPU 13 starts compressing the data identified by a file name contained in the above indication in accordance with the data compression program stored in the RAM 15.

When starting the data compression, the CPU 13 at first prepares a context dictionary and a code table used for a 0th-degree context (context of character 0) on the RAM 15. The contact dictionary is defined as a dictionary (data structure) for storing a character occurring subsequent to the contact and an occurrence frequency of the character according to the context. To begin with, the context dictionary prepared on the RAM 15 holds only information on the 0th context. The same information includes all the characters that might be contained in the data to be compressed and an initial value of the occurrence frequency of each character. Further, the code table for the 0th degree context prepared first on the RAM 15 holds a variable length code (a Huffman code in this apparatus) corresponding to the initial value of the occurrence frequency of each character subsequent to the 0th-degree.

Figure 2:
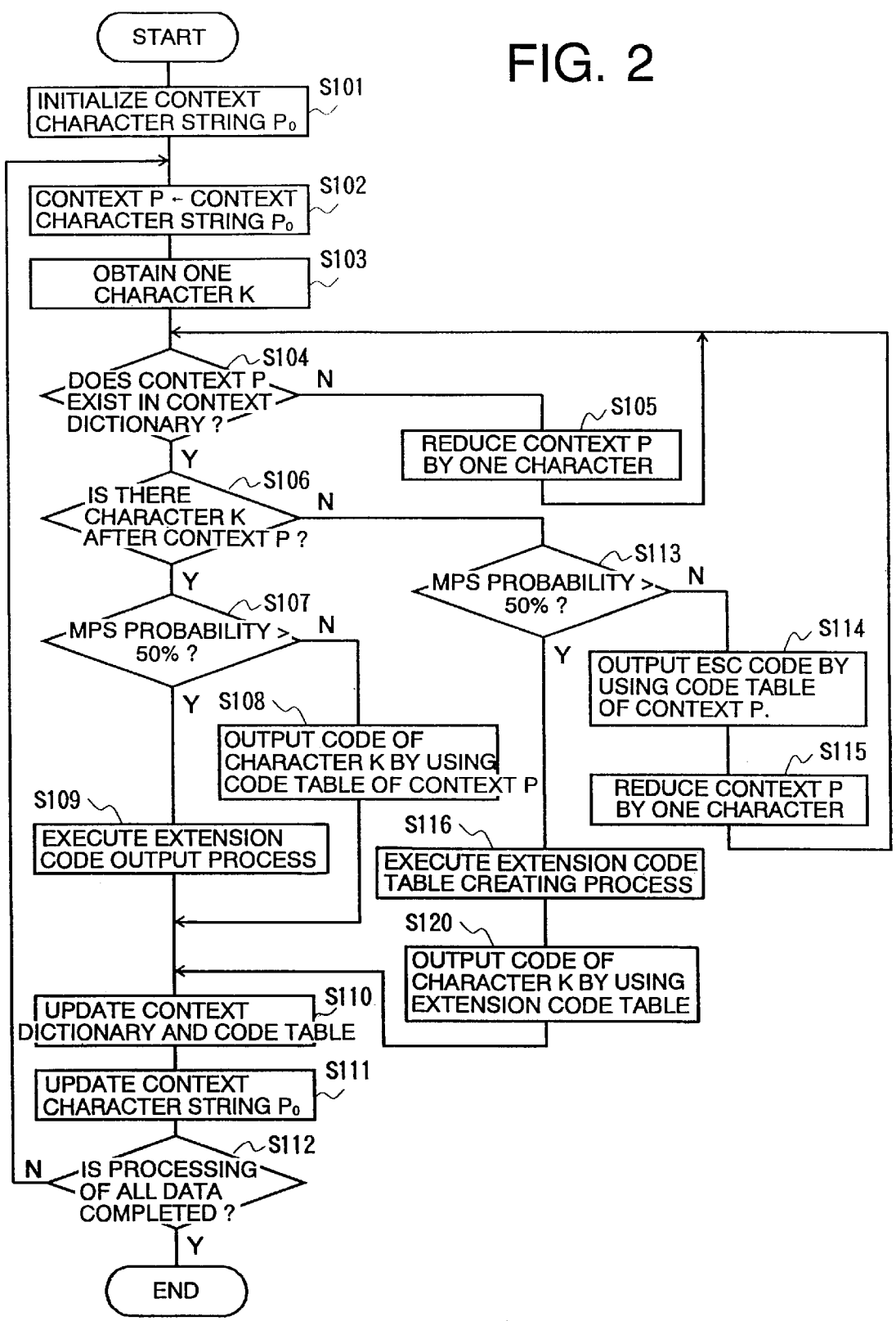
FIG. 2 is a flowchart showing operating procedures of the data compressing apparatus in the first embodiment.

After preparing the above context dictionary and the code table for the 0th-degree context, the CPU 13 compresses the data in accordance with the procedures shown in FIG. 2.

As shown in the Figure, when starting the data compression, the CPU initializes a context character string $P_0$ to a null character string (step S101), and copies a content of the context character string $P_0$ on a context P (step S102). Note that the context character string $P_0$ is a character variable for storing M-pieces (M=3 in the present apparatus) occurring just anterior to the character to be encoded. Further, the context P is a character variable used for determining the context used for encoding and also used for storing the determined context.

Next, the CPU obtains one character K for encoding, from the compression target data (step S103). Thereafter, the CPU judges whether the context P is registered in the context dictionary. If the context P is not registered (step S104: N), one head character is removed, thereby reducing the context P by one character (step S105), and the processing returns to step S104.

When determining whether the context P registered in the context dictionary (step S104; Y), the CPU judges whether the character K subsequent to the context P is registered in the context dictionary (step S106). If the character K subsequent to the context P is registered in the context dictionary (step S106; Y), the CPU judges whether an occurrence probability of a character having maximum occurrence frequency (hereinafter termed "MPS" (Most Probable Symbol)) among the characters subsequent to the context P, exceeds 50% on the basis of the occurrence frequency of each character stored in the context dictionary (step S107).

If the MPS occurrence probability does not exceed 50% (step S107; N), the CPU outputs a code corresponding to the character K in the code table relative to the context P (step S108). Next, the context dictionary is stored with the fact that the character K again occurs subsequent to the context P (a corresponding occurrence frequency is incremented), and the content of the code table relative to the context P is updated (step S110) so that a code having a length inversely proportional to the occurrence frequency of that character is allocated to each character. Note that the CPU, when executing sep S105, registers the context dictionary with a combination of the character K and a context P' of a degree higher by one degree than the theretofore context P in step S110. Further, the CPU creates a code table (a Huffman code table) pertaining to the context P' and stores the RAM with this code table.

Thereafter, the CPU updates a content of the context character string $P_0$ by use of the encoding-finished character K (step S111). That is, the CPU, if the degree of the context character string $P_0$ is the highest degree (3 in this apparatus), adds the character K to a tail of the context character string $P_0$ and sets, as a new context character string $P_0$, the character string obtained by removing one character from the head of the character string to which the character K is added. Further, the CPU, if the degree of the context character string $P_0$ is less than the highest degree, sets, as a new context character string $P_0$, the character string with its tail to which the character K is added.

Subsequently, the CPU judges whether processes on all pieces of data that should be compressed are completed. The CPU, if not completed (step S112; N), returns to step S102 to encode a next character.

On the other hand, if the character K subsequent to the context P is registered in the context dictionary (step S106; Y), and when the MPS occurrence probability exceeds 50% (step S107; Y), the CPU executes an extension code output process (step S109).

Figure 4:
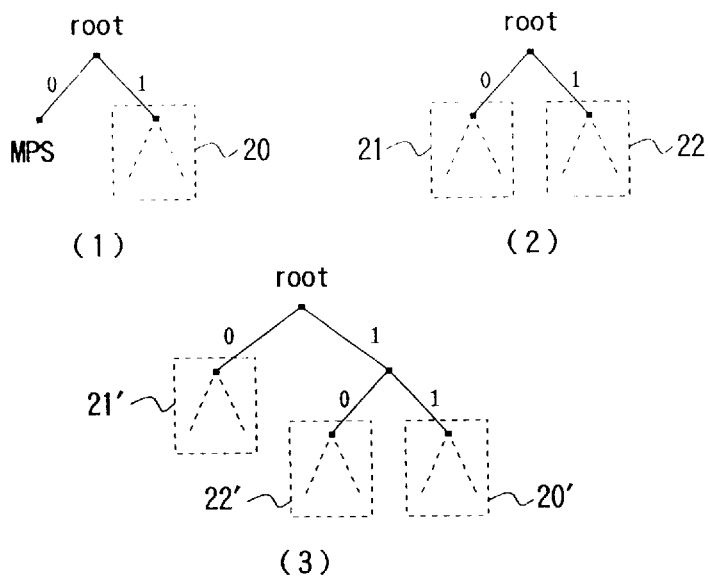
FIG. 4 is an explanatory diagram schematically showing a procedure of creating an extension code table in the data compressing apparatus in the first embodiment.
Figure 5:
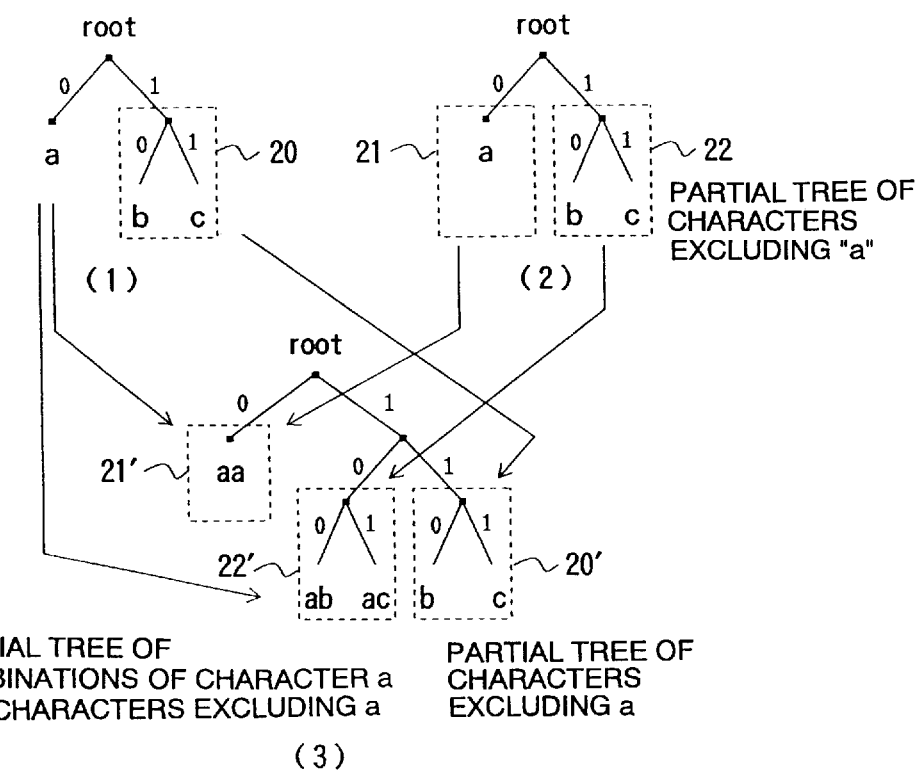
FIG. 5 is an explanatory diagram schematically showing the procedure of creating the extension code table in the data compressing apparatus in the first embodiment.

Hereinafter, referring to FIGS. 3 through 5, the extension code output process is explained in greater detail. Note that FIG. 3 among the above Figures is a flowchart showing operation procedures of the CPU when executing the extension code output process, and FIGS. 4 and 5 are diagrams each illustrating a processing content of an extension code table creating process executed during the extension code output process by use of code trees.

To begin with, an extension code table creating process executed first in the extension code output process will be explained with reference to FIGS. 4 and 5.

In the extension code table creating process, an extension code table is created based on the code table about the context P and the code table relative to the 0th-degree context, wherein the code corresponds to a character string of two characters and to a character. The code stored in each code table within the present data compressing apparatus is defined as the Huffman code, and hence the code table (in which the MPS occurrence probability exceeds 50%) of the context P that is used for creating the extension code table, is expressed by the code trees shown in FIG. 4(1). Further, the code table pertaining to the 0th-degree context is expressed by the code trees shown in FIG. 4(2).

Created in the extension code table creating process is the code table corresponding to the code trees (hereinafter referred to as extension code trees) shown in FIG. 4(3). As illustrated in the Figure, the extension code tree structured such that three partial trees 20', 21', 22' are connected to a root via branches corresponding to "11", "10", "0". The partial tree "20" is the same tree 20 relative to the characters exclusive of the MPS of the code tree pertaining to the context P. That is, the partial trees 20 and 20' assumes the same configuration, wherein the characters made corresponding to respective leaves are also the same. The partial tree 21' takes the same shape as the left partial tree 21 of the code tree relative to the 0th-degree context. However, a character string in which the characters allocated to the corresponding leaves in the partial tree 21 are connected the MPS, is allocated to each leaf of the partial tree 21'. The partial tree 22' has the same configuration as the right partial tree 22 of the code tree pertaining to the 0th-degree context. A character string in which the characters allocated to the corresponding leaves in the partial tree 22 are connected the MPS, is allocated to each leaf of the partial tree 22'.

For example, when the contexts P becomes a target, and if the code trees relative to the context P and to the 0th-degree context are those shown in FIGS. 5(1) and 5(2), an extension code table corresponding to the extension code tree shown in FIG. 5(3) is created. More specifically, there is created an extension code table such as {aa, ab, ac, b, c}={0, 100, 101, 110, 111}. Note that "a" contained in the heads of "aa", "ab" and "ac" corresponds to "a" within the code tree relative to the context P, while "c" corresponds to "b", "c" within the code tree pertaining to the context P. Then, "a", "b", "c" contained in tails of "aa", "ab", "ac" correspond to "a", "b", "c" within the code tree relative to the 0th-degree context.

Thus, in the extension code table created by the extension code table creating process, the character strings ("aa", "ab", "ac") starting with the MPS ("a" in FIG. 5) receive allocations of such codes that bits of the heads of the codes allocated to second characters of the character strings in the code table relative to the 0th-degree context are substituted into "0" ("aa") or "10" ("ab", "ac"). Further, the codes (in which the head bits of the codes for these characters in the code table relative to the 0th-degree are substituted into "11") with additions of "1" to the codes for those characters in the code table of the 0th-degree context, are allocated to the characters ("b", "c") excluding the MPS in the code table pertaining to the context P.

Figure 3:
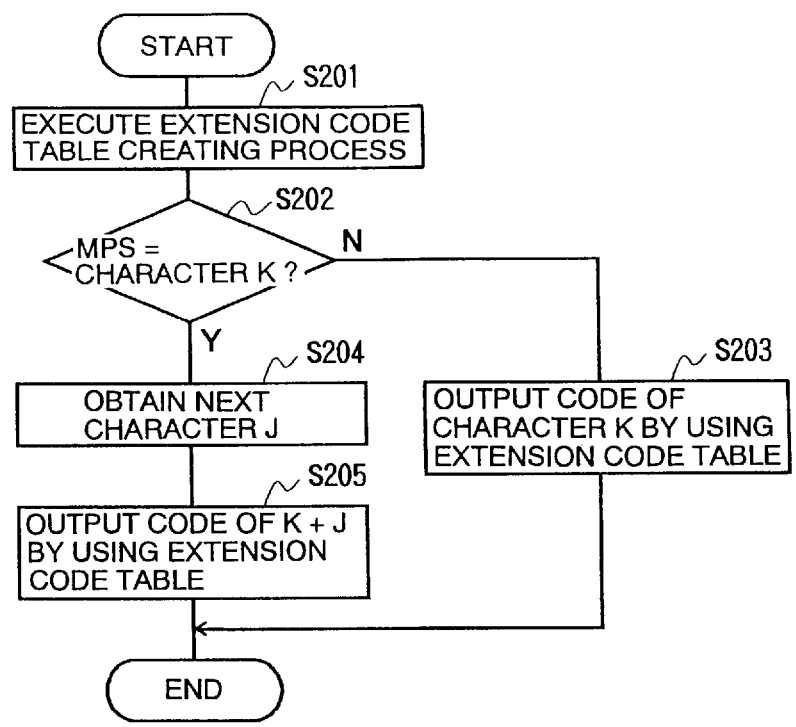
FIG. 3 is a flowchart showing an extension code outputting process executed by the data compressing apparatus in the first embodiment.

Referring to FIG. 3, there will be explained an operation of the CPU after creating the extension code table in the extension code output process. After completing the extension code table creating process (step S201), the CPU judges whether the character K defined as an encoding target character is identical with the MPS of the context P (step S202). If the character K is not identical with the MPS (step S202; N), the CPU outputs the code made corresponding to the character K in the created extension code table (step S203), thus finishing the extension code output process.

Whereas if the character K is identical with the MPS (step S202; Y), the CPU obtains a character J that should be encoded next from the data to be compressed (step S204). Then, the CPU outputs codes made corresponding to a character string consisting of the characters K and J (step S205), thus finishing the extension code output process.

Referring back to FIG. 2, the operation of the data compressing apparatus will go into a further discussion.

When completing the extension code output process (step S119), the CPU proceeds to step S110 and executes the above-mentioned processes there.

Further, if the character K subsequent to the context P is not, although the context P is registered, registered in the context dictionary (step S106; N), the CPU judges whether or not the occurrence probability of the MPS of the context P exceeds 50% (step S113).

If the MPS occurrence probability is under 50% (step S113; N), the CPU outputs a code made corresponding to an ESC (step S114). Then, the CPU deletes one head character of the context P and thus reduces the context P by one character (step S115), and the processing returns to step S104.

Whereas if the MPS occurrence probability exceeds 50% (step S113; Y), the CPU executes the extension code table creating process (step S116). This extension code table creating process is absolutely the same as the process that has already been explained and executed in step S201 in FIG. 3. Then, the CPU outputs the code corresponding to the character K in the extension code table created in step S116 (step S120).

In step S110 executed after step S120, a combination of the context P with the character K is registered in the context dictionary, and the character K is added to the code table pertaining to the context P (step S110).

Thereafter, the CPU updates the context character string $P_0$ (step S111) and finishes the data compression just when completing the processes for all pieces of data (step S112; Y).

In the thus constructed first data compressing apparatus, for instance, if occurrence probabilities P of three kinds of characters a, b and c occurring after a certain context $P_x$ are P(a)=75%, P(b)=12.5%, and P(c)=12.5%, there is created a code table relative to the context $P_x$, which has a context such as {a, b, c}={10, 11}.

Then, when the context $P_x$ occurs once again, the MPS occurrence probability exceeds 50%, and therefore this code table and the code table relative to the 0th-degree context are combined to create an extension code table. For example, if the code table pertaining to the 0th-degree context has a content such as {a, b, c}={0, 10, 11}, the code table relative to the context $P_x$ and the code table relative to the 0th-degree context are expressed respectively by the code trees shown in FIGS. 5(1) and 5(2). Accordingly, it follows that the extension code table having content of {aa, ab, ac, b, c}={0, 100, 101, 110, 111} as shown in FIG. 5(3), is to be created.

Figure 6:
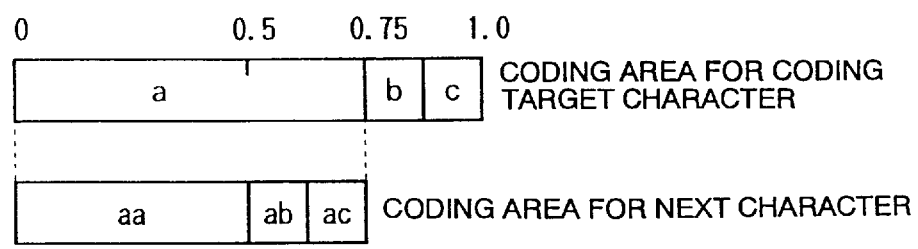
FIG. 6 is a diagram showing an example of dividing a coding area in an extension code table.

In this extension code table, as schematically shown in FIG. 6, a character string ("aa", "ab", "ac") starting with the MPS (character "a") is encoded based on a 2-character unit. Therefore, an encoding space for the encoding target character in the above extension code table corresponds much better to an actual occurrence probability of each character as shown in the Figure. Hence, according to the present data compressing apparatus, the data are compressed more efficiently than by using the code table in which the code is allocated to every character.

Note that the data compressing apparatus in the first embodiment can be modified in a variety of forms. For instance, the data compressing apparatus may be constructed so as to use a code table different from the code table for the 0th-degree context when creating the extension code table. Further, there may also be made such an arrangement that the characters can be added to the code table relative to the 0th-degree context by fixing encoding procedures in case of no encoding target character existing in the code table about the 0th-degree context. Moreover, code tables pertaining to some contexts may also be prepared when starting the data compression. Additionally, as a matter for course, there may be employed a variable length coding method such as coding an order of the characters, excluding the Huffman coding.

Further, the apparatus may also be so constructed as to previously prepare a static code table for every context and to select coding based on the extension code table and coding based on the normal code table in accordance with occurrence probabilities of re-occurred characters within these code tables.

<Data Restoring Apparatus>

A data restoring apparatus in the first embodiment is an apparatus for restoring the data compressed by the data compressing apparatus in the first embodiment. The data restoring apparatus in the first embodiment has also the CPU-assisted construction as in the case of the data compressing apparatus in the first embodiment. Further, when starting the data restoration, the context dictionary and the code table having absolutely the same contents as those that have been prepared on the RAM when actuating the data compressing apparatus in the first embodiment, are prepared on a RAM of the data restoring apparatus in the first embodiment.

Figure 7:
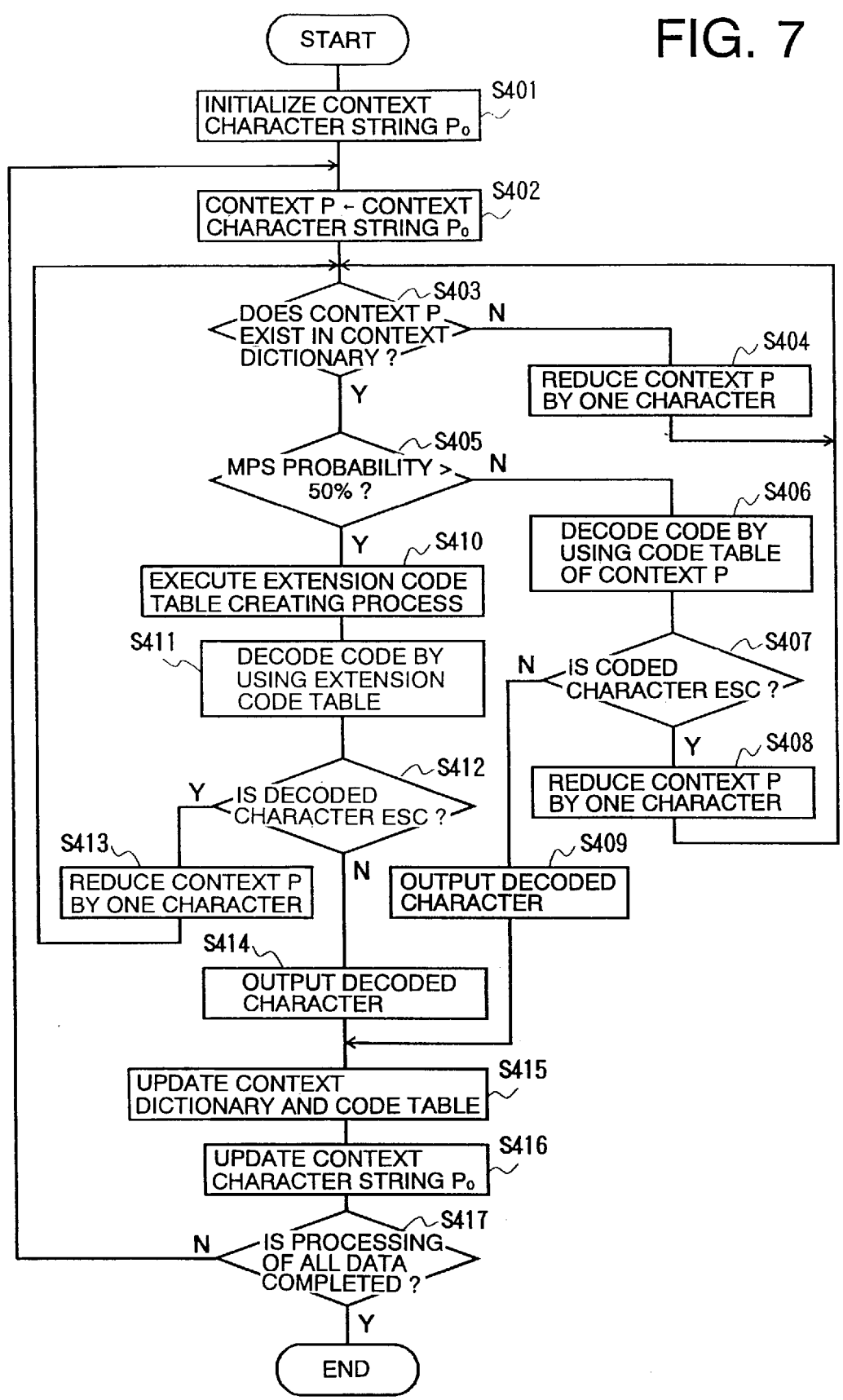
FIG. 7 is a flowchart showing data restoring procedures by a data restoring apparatus in a first embodiment.

FIG. 7 shows operating procedures of the data restoring apparatus (CPU) in the first embodiment.

When starting the data restoration, the CPU at first initializes the context character string $P_0$ to the null character string (step S401). The CPU subsequently copies a content of the context character string $P_0$ on the context P (step S402) and judges whether or not the context P is registered in the context dictionary (step S403).

If the context P is not registered (step S403: N), the CPU eliminates one head character, thereby reducing the context P by one character (step S404), and the processing returns to step S403.

When finding out the context P registered in the context dictionary (step S403; Y), the CPU judges whether the MPS occurrence probability exceeds 50% on the basis of the occurrence probability of each character relative to the context P (step S405). Then, if the MPS occurrence probability is under 50% (step S405; N), the CPU decodes the code by use of the code table about the context P (step S406).

Then, if the decoded character is the ESP (step S407; Y), the CPU reduces the context P by one character (step S408), and returns to step S402. Whereas if the decoded character is not the ESC (step S407; N), the CPU outputs that character (step S409) and proceeds to step S415. Note that the processing branches off to an "N" side in step S407 just when the code outputted in step S108 in FIG. 2 is decoded. Further, the processing branches off to a "Y" side just when the code outputted in step S114 in FIG. 2 is decoded.

If the occurrence probability of the MPS relative to the context P exceeds 50% (step S405; Y), the CPU executes an extension code table creating process (step S410). The extension code table creating process performed in this step is the same as the extension code table creating process executed in the data compressing apparatus in the first embodiment and therefore omitted in its explanation.

Thereafter, the CPU decodes the code by use of a created extension cod e table (step S411). If the decoded character is the ESC (step S412; Y), the CPU reduces the context P by one character (step S413) and returns to step S403. While on the other hand, if the decoded character is not the ESC (step S412; N), the CPU outputs the decoded character (step S414). Note that step S414 is executed just when the code outputted in step S109 or S120 in FIG. 2 is decoded.

Thereafter, the CPU updates contents of the context dictionary and the code table in accordance with the content of the processing executed (step S415). Subsequently, the context character string $P_0$ is updated corresponding to the number of characters that are actually outputted (step S416).

Next, the CPU judges whether or not the restoration of all the data is completed. If not completed (step S417; N), the processing returns to step S402. The CPU repeats the processes of steps S402 through S416 and, when completing the processes for all the data (step S417; Y), finishes the data restoring process.

Second Embodiment

<Data Compressing Apparatus>

Figure 8:
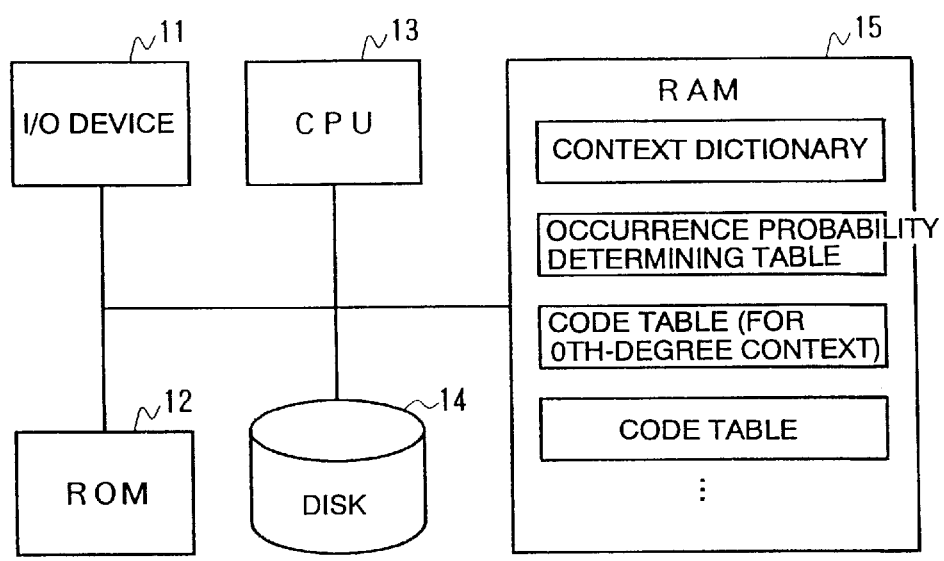
FIG. 8 is a block diagram illustrating a construction of a data compressing apparatus in a second embodiment of the present invention.

FIG. 8 shows a construction of a data compressing apparatus in a second embodiment. As illustrated in FIG. 8, the data compressing apparatus in the second embodiment includes, as in the case of the data compressing apparatus in the first embodiment, the I/O unit 11, the ROM (Read-Only Memory) 12, the CPU (Central Processing Unit) 13, the disk storage device 14 and the RAM (Random Access memory) 15 as principal components.

When actuating the data compressing apparatus in the second embodiment, the RAM 15 is prepared with a context dictionary, an occurrence probability determining table, a code table used for the 0th-degree context and several code tables for 1st- through 3rd-degree contexts. The context dictionary holds data about contexts prepared with the code tables and is used for determining whether the code table exists or not. Each code table within the RAM 15 is a table in which the codes are made corresponding to all the characters that have occurred after the corresponding contexts, and the code having a code length corresponding to a general occurrence probability at which the concerned character occurs posterior to the corresponding context, is made corresponding to each character. Further, in the code table having the character the occurrence probability of which exceeds 50% among the code tables, a 1-bit code is made corresponding to this character (MPS).

The occurrence probability determining table is a table for storing an item of occurrence probability determining data. The occurrence probability determining data are data of numerical values, and the occurrence probability determining data within the occurrence determining table prepared when started are all "0".

According to the present apparatus, there is executed neither a new registration of the context nor the change in the context of the code table. Then, whether or not the MPS occurrence probability exceeds 50% is determined (estimated) based on the occurrence probability determining data within the occurrence probability determining table. If the MPS occurrence probability exceeds 50%, the coding is carried out by use of the extension code table.

Hereinafter, referring to FIG. 9, the data compressing procedures by the present data compressing apparatus will be explained in detail.

When starting the data compression, the CPU at first initializes the context character string $P_0$ to the null character string (step S501). Subsequently, the CPU copies the content of the context character string $P_0$ on the context P (step S502) and obtains one character K for encoding, from the compression target data (step S503). Thereafter, the CPU judges whether the context P is registered in the context dictionary. If the context P is not registered (step S504: N), one head character is removed, thereby reducing the context P by one character (step S505), and the processing returns to step S504.

When finding out the context P registered in the context dictionary (step S504; Y), the CPU determines whether the occurrence probability of the MPS within the code table for the context P exceeds 50% on the basis of the occurrence probability determining data about the context P that are stored in the occurrence probability determining table (step S506). A specific determining procedure in this step will be mentioned later.

When determining that the MPS occurrence probability is under 50% (step S506; Y), the CPU outputs the code made corresponding to the character K (step S507) and proceeds to step S509. While on the other hand, if the MPS occurrence exceeds 50% (step S506; N), the CPU executes the extension code output process (step S508).

Figure 10:
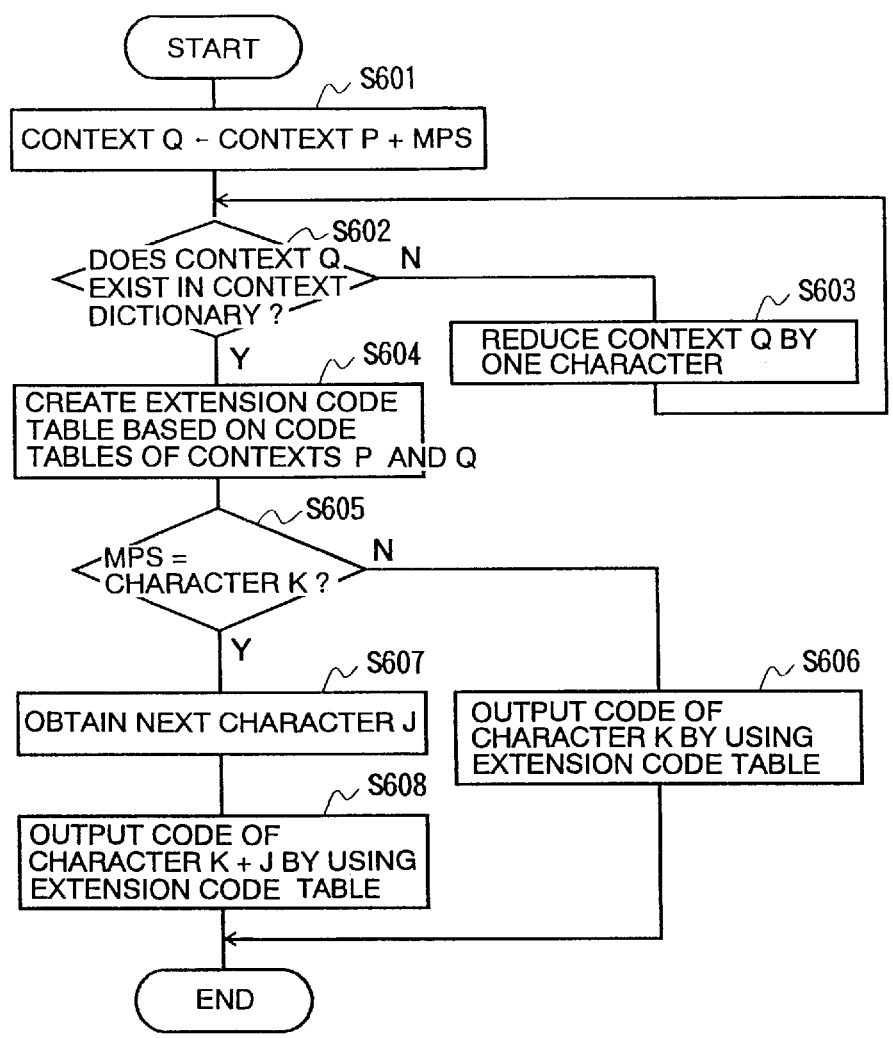
FIG. 10 is a flowchart sowing an extension code outputting process executed by the data compressing apparatus in the second embodiment.

FIG. 10 shows an operating procedure of the data compressing apparatus (CPU) during the extension code output process. As shown in FIG. 10, when starting the extension code output process, the CPU at first sets, in a context Q, a character string in which the MPS is added to a tail of the context P (step S601). Subsequently, the CPU judges whether or not the context Q is registered in the context dictionary. If not registered (step S602; N), the CPU removes one head character and thus reduces the context Q by one character (step S603), a nd the processing returns to step S602.

When finding out the context Q (step S602; Y), the CPU creates an extension code table by combining the context P with the code table for the context Q (step S604). The procedure of creating the extension code table in this step is the same as the procedure of creating the extension code table that has been made in the data compressing apparatus in the first embodiment, except for the fact that the code table combined therewith is the code table for the context Q. For example, if the code tables for the contexts P and Q are those as shown in FIGS. 11(a) and 11(b), an extension code table shown in FIG. 11(c) is to be created. Note that each code table is a code table often used when making the orders of the characters corresponding to the codes. The codes shown in FIGS. 11(a) and 11(b) are known as a Unary code and a Golomb code.

Figure 12:
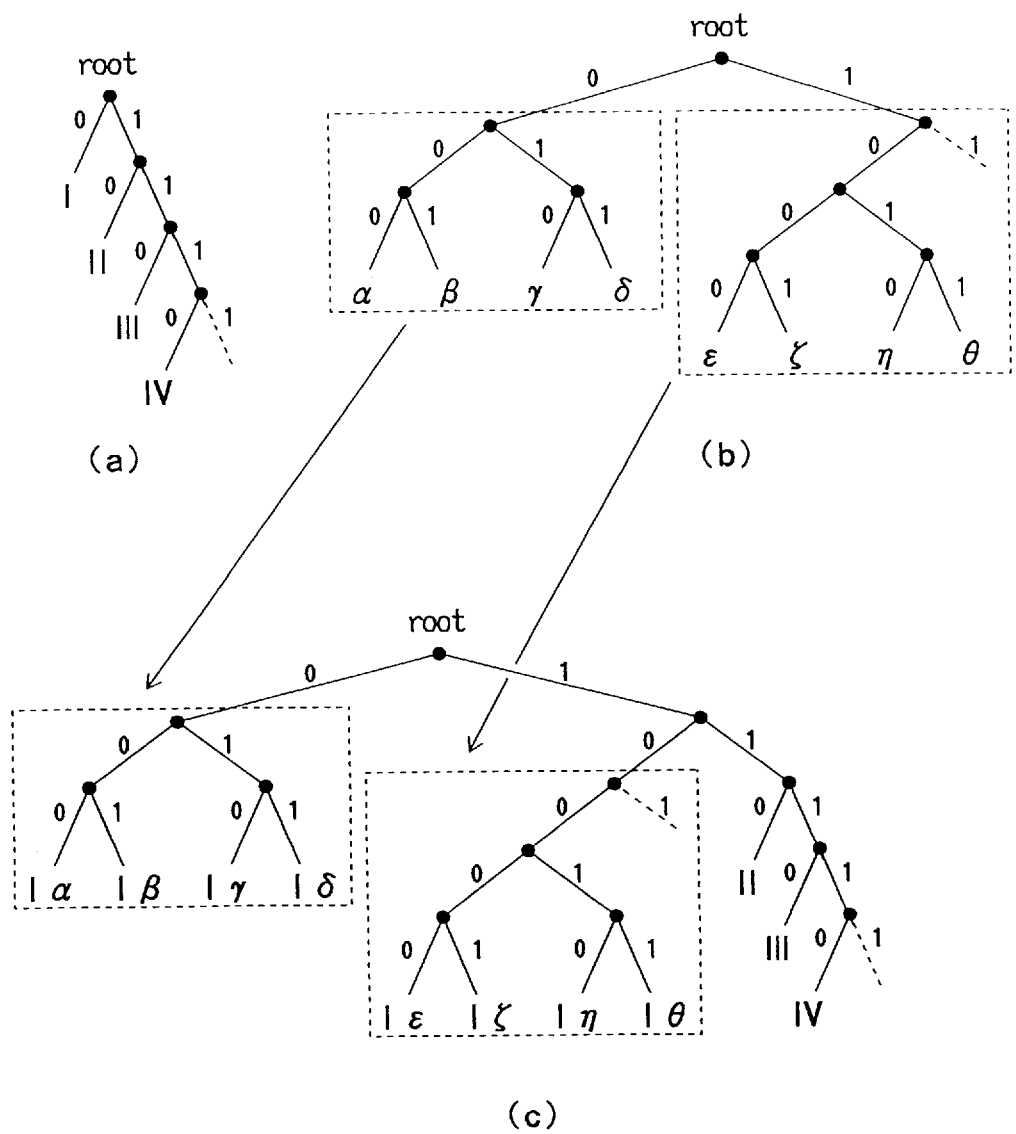
FIG. 12 is an explanatory diagram schematically showing a procedure of creating the extension code table in the data compressing apparatus in the second embodiment.

As shown in the Figures, in the extension code table created from those codes by the procedure that has already been explained, a character string consisting of two characters such as Iα–Iδ is expressed by a code having the same length as one-character code such as α–δ relative to the context Q. That is, a character I contained in each of the character strings such as Iα–Iδ among the characters I each expressed by one bit in the code table relative the context P, is expressed by one bit or less in this extension code table. Therefore, according to this extension code table, it follows that there is attained a higher compression rate than by coding effected for every character. FIG. 12 illustrates code trees corresponding to the respective code tables.

After creating the extension code table, the CPU judges whether or not the MPS of the context P coincident with the character K. If not coincident there with (step S605; N), the CPU outputs the code of the character K by use of the created extension code table (step S606). While on the other hand, if the MPS of the context P is coincident with the character K (step S605; Y), the CPU obtains a character J that should be encoded next (step S607) and outputs a code made corresponding to a character string such as "character K+character J" within the extension code table (step S608), and the extension code output process is thus ended (the processing proceeds to step S509 in FIG. 9).

Figure 9:
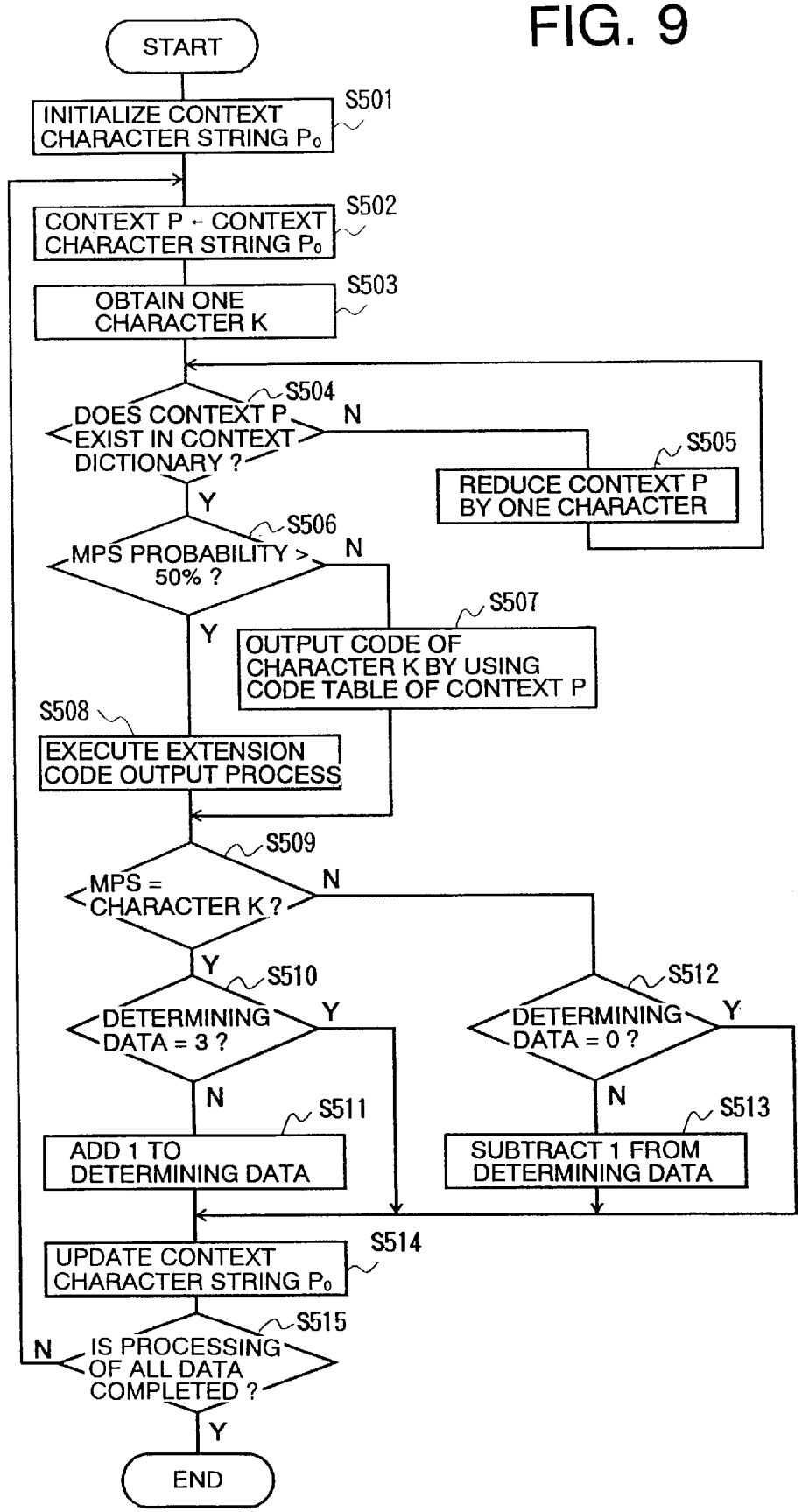
FIG. 9 is a flowchart showing operating procedures of the data compressing apparatus in a second embodiment.

Steps S509–S513 in FIG. 9 are steps for updating the occurrence probability determining table. As shown in FIG. 9, the CPU at first judges whether the encoding-finished character K is coincident with the MPS of the context P (step S509). Then, if the character K is coincident with the MPS (step S509; Y), the CPU judges whether or not the occurrence probability determining data (simply referred to as determining data in FIG. 9) relative to the context P is "3" (step S510). If the occurrence probability determining data is not "3" (step S510; N), the CPU adds "1" to the occurrence probability determining data (step S511) and proceeds to step S514. Whereas if the occurrence probability determining data is "3" (step S510; Y), the CPU proceeds to step s514 without updating the occurrence probability determining data.

Further, if the character K is not coincident with the MPS (step S502; N), the CPU judges whether the occurrence probability determining data is "0" (step S512). Then, the CPU, if the occurrence probability determining data is not "0" (step S512; N), subtracts "1" from the occurrence probability determining data (step S513) and proceeds to step S514. Whereas if the occurrence probability determining data is "0" (step S512; Y), the CPU proceeds to step S514 without updating the occurrence probability determining data.

According to the above occurrence probability updating procedures (step S509–S513), if the MPS occurrence probability exceeds 50%, the number of times with which to add "1" to the occurrent probability determining data is larger than the number of times with which to subtract "1" from the occurrence probability determining data, and hence the occurrence probability determining data takes a value in the vicinity of 3. Whereas if the MPS occurrence probability is under 50%, the number of times with which to add "1" to the occurrent probability determining data is smaller than the number of times with which to subtract "1" from the occurrence probability determining data, and hence the occurrence probability determining data takes a value in the vicinity of 0.

Accordingly, if the occurrence probability determining data is "2" or larger, it can be assumed that the MPS occurrence probability exceeds 50%. If not more than "2", it can be assumed that the MPS occurrence probability is under 50%. Based on this fact, in step S506 described above, if the occurrence probability determining data is "2" or larger, the CPU executes branching-off to the "Y" side and, if less than "2", executes branching-off to the "N" side.

After executing the occurrence probability determining table updating process, the CPU updates the context character string $P_0$ by use of the encoding-finished character or character string (step S514). Next, the CPU judges whether the processes for all the data are completed. If some characters remain unprocessed (step S515; N), the CPU returns to step S502 and starts coding the next character there. Then, the CPU, after executing the above-described series of processes upon all the data (step S515; Y), finishes the data compressing process.

As discussed above, according to the data compressing apparatus in the second embodiment, if the code table used for encoding the encoding target character contains the character the occurrence probability of which is assumed to exceed 50%, the code is allocated to the character string consisting of the encoding target character and one more character (which implies an expansion of the information source), and then the encoding target character is encoded. Further, the expansion of the information source involves a combination of two code tables, and therefore the present data compressing apparatus is capable of attaining the data compression at a high speed and a high compression rate.

Note that the data compressing apparatus in the second embodiment can be, although the numerical value data are used as the occurrence probability determining data, provided with a shift register, corresponding to each context, for storing the occurrence probability determining data.

Figure 13:
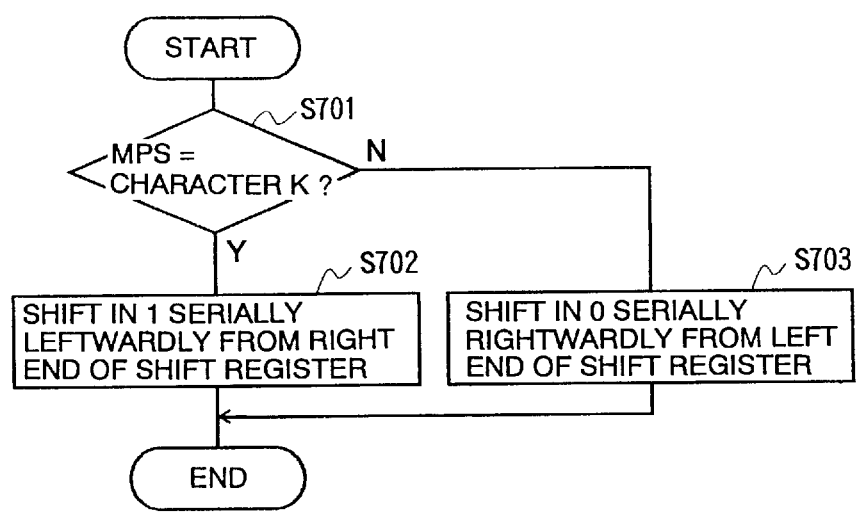
FIG. 13 is a flowchart showing a content of a data updating procedure for determining an occurrence probability when using a shift register for storing occurrence probability determining data.

FIG. 13 shows an occurrence probability determining data updating procedure when using the shift register. In this case, if the MPS is coincident with the character K (step S701; Y), "1" is leftwardly shifted in from a right end of the shift register for a theretofore target context (step S702). Whereas if the MPS is coincident with the character K (step S701; N), "0" is rightwardly shifted in from a left end of the shift register (step S703).

Figure 14:
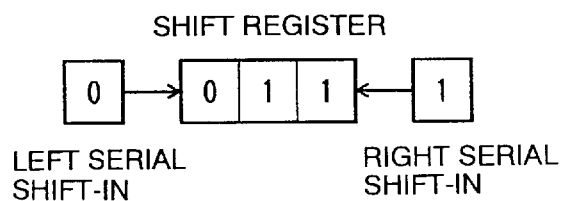
FIG. 14 is an explanatory diagram showing a content of operation of the shift register when using the shift register for storing the occurrence probability determining data.
Figure 15:
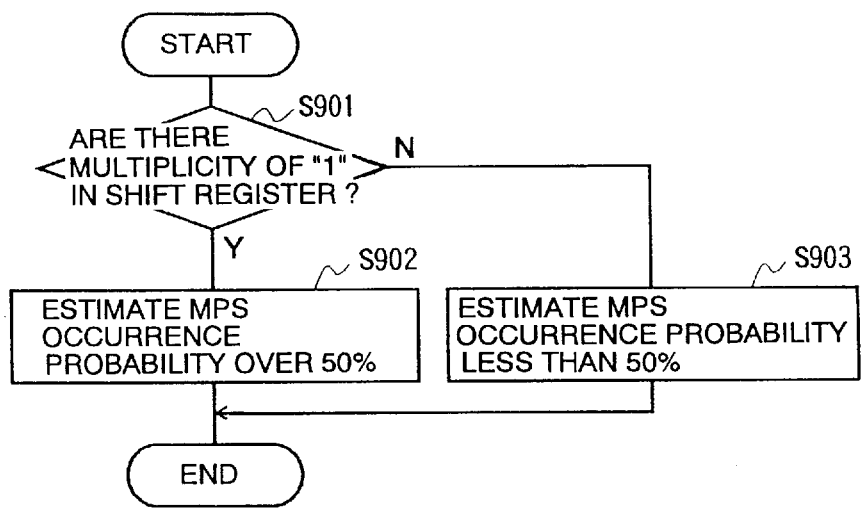
FIG. 15 is a flowchart sowing an occurrence probability estimating procedure when using the shift register for storing the occurrence probability determining data.

The contents of the shift register are thus updated, and, with this updating process, as schematically shown in FIG. 14, if a larger number of "1" than "1" are store din the shift register, it can be determined that the occurrence probability of the corresponding MPS exceeds 50%. Therefore, as schematically shown in FIG. 15, whether or not a multiplicity of "1" exist in the shift register is determined. If the multiplicity of "1" exist therein (step S901; Y), it can be assumed that the MPS occurrence probability exceeds 50% (step S902). Then, if the multiplicity of "1" do not exist in the shift register (step S901; N), it is assumed that the MPS occurrence probability is less than 50% (step S902).

Note that the above construction is effective particularly when the data compressing apparatus in the second embodiment is constructed based on ICs.

<Data Restoring Apparatus>

A data restoring apparatus in the second embodiment restores the data compressed by the data compressing apparatus in the second embodiment. The data restoring apparatus in the second embodiment has also the CPU-assisted construction as in the case of the data compressing apparatus in the second embodiment. Further, when starting the data restoration, the context dictionary, the occurrence probability determining table and the code table having absolutely the same contents as those that have been prepared on the RAM when actuating the data compressing apparatus in the second embodiment, are prepared on a RAM of the data restoring apparatus in the second embodiment.

Figure 16:
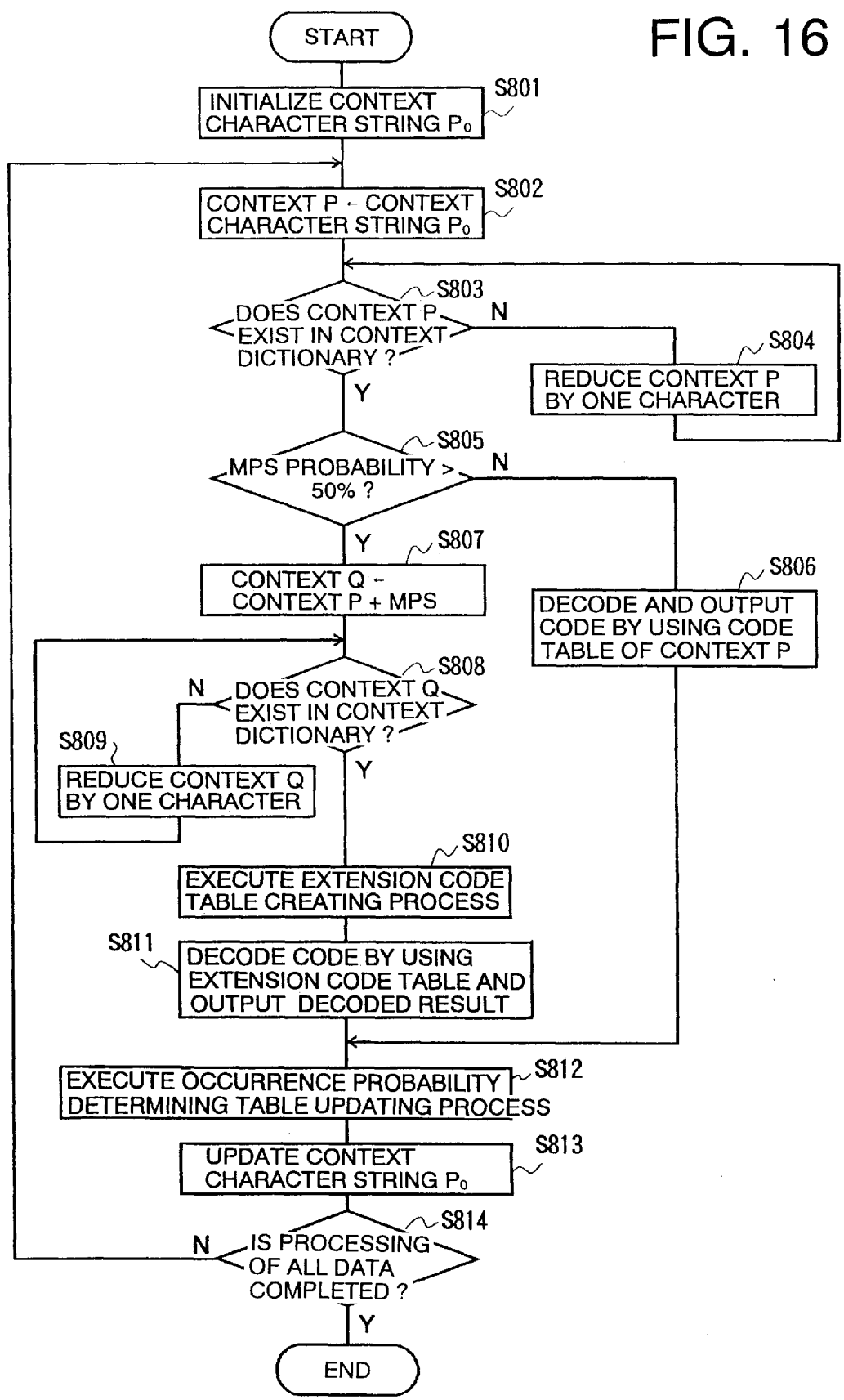
FIG. 16 is a flowchart showing a data restoring procedure by a data restoring apparatus in a second embodiment of the present invention.
Figure 17:
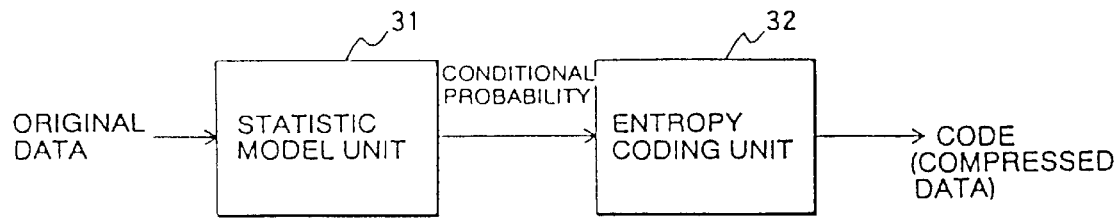
FIG. 17 is a block diagram illustrating a basic construction of the data compressing apparatus for executing a statistical type compression.
Figure 18:
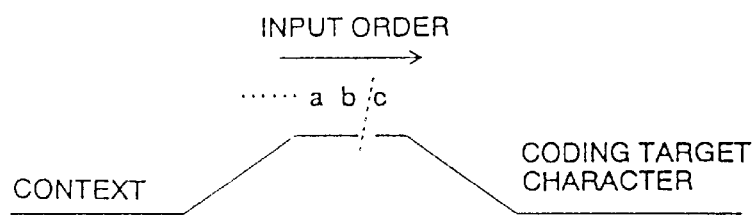
FIG. 18 is a diagram of assistance in explaining an operation of a statistic model unit.
Figure 19:
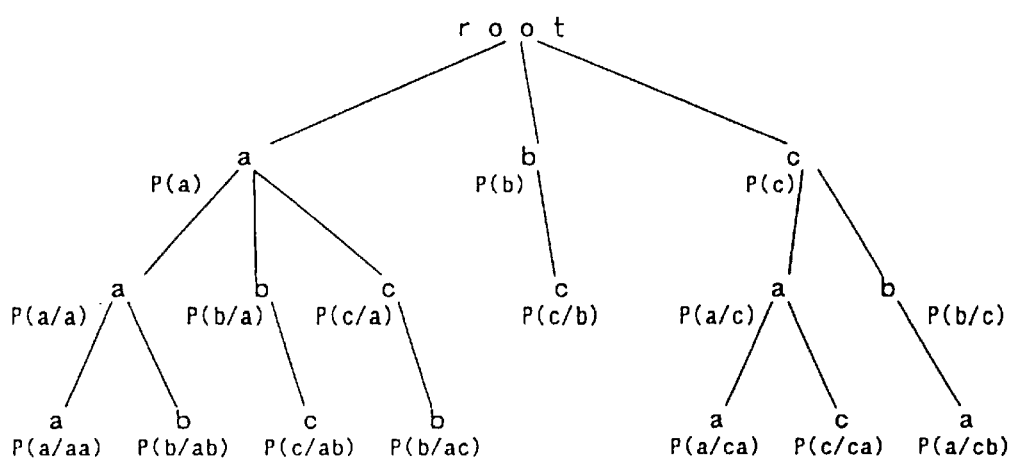
FIG. 19 is a diagram showing one example of a tree structure used when collecting contexts.

A data restoring procedure by the data restoring apparatus (CPU) in the second embodiment will hereinafter be explained with reference to FIG. 16.

When starting the data restoration, the CPU at first initializes the context character string $P_0$ to the null character string (step S801). The CPU subsequently copies a content of the context character string $P_0$ on the context P (step S802) and judges whether or not the context P is registered in the context dictionary (step S803).

If the context P is not registered (step S803: N), the CPU eliminates one head character, thereby reducing the context P by one character (step S804), and the processing returns to step S803. When finding out the context P registered in the context dictionary (step S803; Y), the CPU judges whether the MPS occurrence probability exceeds 50% by making a comparison in magnitude between the occurrence probability determining data relative to the context P within the occurrence probability determining table and a predetermined value (=2) (sep S805).

If the MPS occurrence probability is under 50% (step S805; N), the CPU decodes the code by use of the code table about the context P (step S806) and outputs a character as a decoded result, and the processing proceeds to step S812.

While on the other hand, if the MPS occurrence probability exceeds 50% (step S805; Y), the CPU sets, in the context Q, a character string in which the MPS is added to a tail of the context P (step S807). Subsequently, if the context Q is not registered in the context dictionary (step S808; N), the CPU reduces the context Q by one character by deleting one head character (step S809) and returns to step S808.

When finding out the context Q registered in the context dictionary (step S808; Y), the CPU creates an extension code table by combining the context P with the code table for the context Q (step S810). Subsequently, the CPU decodes the code by use of the extension code table and outputs a character or a character string as a decoded result (step S811).

Thereafter, the CPU executes an extension code table updating process (step S812). In this step, the same processes as step S509–S513 in FIG. 9 are executed. Next, the CPU updates the context character string $P_0$ (step S813) and, if the data to be processed are left (step S814; N), returns to step S802.

The CPU repeats processes of steps S802–S813 and, when completing the processes for all the data (step S814; Y), finishes the data restoring process.

It is apparent that, in this invention, a wide range of different working modes can be formed based on the invention without deviating from the spirit and scope of the invention. This invention is not restricted by its specific working modes except being limited by the appended claims.

What is claimed is:

1. A data compressing apparatus, comprising:
    coding table storing means for storing a plurality of code tables, in which characters are made corresponding to codes, each related to a different context;
    obtaining means for obtaining a coding target character to be coded, from a character string that should be compressed;
    context specifying means for specifying a context occurred just anterior to the coding target character obtained by said obtaining means;
    first coding means for, if the code table stored in said code table storing means with respect to a context specified by said context specifying means is a code table comprising a character having an occurrence probability exceeding 50%, creating an extension code table in which the codes are made corresponding to a character string comprising two characters starting with the character having an occurrence probability of over 50% and a character excluding the character having an occurrence probability of over 50% by modifying the code table, and coding the character string comprising the coding target character, or the coding target character and a character next thereto, by use of the created extension code table; and
    second coding means for, if the code table stored in said code table storing means with respect to the context specified by said context specifying means is the code table not having a character with an occurrence probability of over 50%, coding the coding target character by use of this code table.

2. A data compressing apparatus comprising:
    code table storing means for storing a plurality of code tables, in which characters are made corresponding to codes, each related to a different context;
    obtaining means for obtaining a coding target character to be coded, from a character string that should be compressed;
    context specifying means for specifying a context occurred just anterior to the coding target character obtained by said obtaining means;
    determining means for determining whether an occurrence probability of a most frequently occurred character, i.e., the character exhibiting the highest occurrence probability among the characters within the code table stored in said code table storing means with respect to the context specified by said context specifying means, exceeds 50% or not;

code outputting means for, when said determining means determines that the occurrence probability of the most frequently occurred character does not exceed 50%, outputting a code made corresponding to the coding target character in the code table relative to the context that is stored in said code table storing means;

extension code table creating means for, when said determining means determines that the occurrence probability of the most frequently occurred character exceeds 50%, setting one code table stored in said code table storing means as a first code table, and creating an extension code table structured such that the codes are made corresponding to a character string in which each character within the first code table is subsequent to the most frequently occurred character in a second code table and to each character excluding the most frequently occurred character in the second code table on the basis of the first code table and the second code table for the context specified by said context specifying means;

extension code outputting means for, when said extension code table creating means creates the extension code table, outputting the code made corresponding to the coding target character in the extension code table if the coding target character is not the most frequently occurred character in the second code table, obtaining a character that should be coded next if the coding target character is the most frequently occurred character in the second code table, and outputting the code made corresponding to a character string consisting of the coding target character and the obtained character in the extension code table; and updating means for, when said code outputting means or said extension code outputting means outputs the code for the coding target character, updating a content of the code table relative to the context specified by said context specifying means so that a code with a shorter code length is made corresponding to a character exhibiting a larger occurrence probability.

3. A data compressing apparatus according to claim 2, wherein said extension code table creating means, when creating the extension code table, uses, as a code for the character string starting with the most frequently occurred character, the code in which the head bit of the code, in the first code table, made corresponding to a character subsequent to the most frequently occurred character within the character string, is substituted into one of "0" and "10" in accordance with a value of the head bit, and uses, as a code for the character exclusive of the most frequently occurred character in the second code table, a code in which the head bit of the code made corresponding to the character in the second table is substituted into "11".

4. A data compressing apparatus comprising:

code table storing means for storing a plurality of code tables, in which characters are made corresponding to codes, each related to a different context;

determining data storing means for storing plural pieces of determining data in relation to contexts;

obtaining means for obtaining a coding character to be coded, from a character string that should be compressed;

context specifying means for specifying a context occurred just anterior to the coding target character obtained by said obtaining means;

determining means for determining whether an occurrence probability of a most frequently occurred character defined as a character to which a 1-bit code is made corresponding in the code table relative to a context specified by said context specifying means on the basis of determining data stored in said determining data storing means with respect to the specified context, exceeds 50% or not;

code outputting means for, when said determining means determines that the occurrence probability of the most frequently occurred character does not exceed 50%, outputting a code made corresponding to the coding target character in the code table relative to the context specified by said context specifying means that is stored in said code table storing means;

extension code table creating means for, when said determining means determines that the occurrence probability of the most frequently occurred character exceeds 50%, setting one of the code tables stored in said code table storing means as a first code table, and creating an extension code table structured such that the codes are made corresponding to a character string in which each character within the first code table is subsequent to the most frequently occurred character in a second code table and to each character excluding the most frequently occurred character in the second code table on the basis of the first code table and the second code table related to the context specified by said context specifying means;

extension code outputting means for, when said extension code table creating means creates the extension code table, outputting the code made corresponding to the coding target character in the extension code table if the coding target character is not the most frequently occurred character in the second code table, obtaining a character that should be coded next if the coding target character is the most frequently occurred character in the second code table, and outputting the code made corresponding to a character string consisting of the coding target character and the obtained character in the extension code table; and updating means for, when said code outputting means or said extension code outputting means outputs the code, updating a content of the determining data within said determining data storing means with respect to the context specified by said context specifying means, depending on whether or not the coding target character is coincident with the most frequently occurred character in the code table related to the context specified by said context specifying means.

5. A data compressing apparatus according to claim 4, wherein said determining data storing means is stored with numerical value data as determining data, said determining means determines, if the determining data is larger than a predetermined fiducial value, that the occurrence probability of the most frequently occurred character exceeds 50%, and said updating means, if the coding target character is coincident with the most frequently occurred character, adds a predetermined value to the determining data but, if the coding target character is not coincident with the most frequently occurred character, subtracts the predetermined value from the determining data.

6. A data compressing apparatus according to claim 4, wherein said determining data storing means is constructed of a plurality of shift registers each related to the context, said determining means, if said shift register relative to the context specified by said context specifying means contains "1" the number of which is larger than the predetermined fiducial value, determines that the occurrence probability of the most frequently occurred character exceeds 50%, and said updating means, if the coding target character is coincident with the most frequently occurred character, inputs "1", from one end thereof, to said shift register corresponding to the context specified by said context specifying means and shifts, by one bit, a content of said shift register toward the other end thereof, and, whereas if the coding target character is not coincident with the most frequently occurred character, inputs "0", from the other end thereof, to said shift register corresponding to the context specified by said context specifying means and shifts, by one bit, the content of said shift register toward one end thereof.

7. A data restoring apparatus, comprising:

code table storing means for storing a plurality of code tables, in which characters are made corresponding to codes, each related to a different context;

context specifying means for specifying a context used for decoding the code;

first decoding means for, if the code table stored in said code table storing means with respect to the context specified by said context specifying means is a code table comprising a character having an occurrence probability exceeding 50%, modifying the code table to create an extension code table in which codes are made corresponding to a character string comprising two characters starting from the character having an occurrence probability of over 50% and the character having an occurrence probability not exceeding 50%, and decoding the appropriate code by use of the extension code table; and second decoding means for, if the code table stored in said code table storing means with respect to the context specified by said context specifying means is a code table not having a character with an occurrence probability of over 50%, decoding the appropriate code by use of the code table.

8. A data restoring apparatus comprising:

code table storing means for storing a plurality of code tables, in which characters are made corresponding to codes, each related to a different context;

context specifying means for specifying a context used for decoding the code;

determining means for determining whether an occurrence probability of a most frequently occurred character exhibiting a highest occurrent probability among characters within the code tables stored in said code table storing means with respect to the context specified by said context specifying means, exceeds 50% or not;

character outputting means for, if said determining means determines that the occurrence probability of the most frequently occurred character does not exceed 50%, outputting the character made corresponding to a code that should be decoded in the code table stored in said code table storing means with respect to the context specified by said context specifying means;

extension code table creating means for, when said determining means determines that the occurrence probability of the lost frequently occurred character exceeds 50%, setting one code table stored in said code table storing means as a first code table, and creating an extension code table structured such that the codes are made corresponding to a character string in which each character within the first code table is subsequent to the most frequently occurred character in a second code table and to each character excluding the most frequently occurred character in the second code table on the basis of the first code table and the second code table relative to the context specified by said context specifying means;

character/character string outputting means for outputting a character or a character string made corresponding to the code that should be decoded in the extension code table created by said extension code table creating means; and updating means for, when said character outputting means or said character/character string outputting means outputs the character or the character string, updating a content of the code table relative to the context specified by said context specifying means so that a code having a shorter code length is made corresponding to a character having a larger occurrence probability.

9. A data restoring apparatus according to claim 8, wherein said extension code table creating means, when creating the extension code table, uses, as a code for the character string starting with the most frequently occurred character, the code in which the head bit of the code, in the firs code table, made corresponding to a character subsequent to the most frequently occurred character within the character string, is substituted into "0" or "10" in accordance with a value of the head bit, and uses, as a code for the character exclusive of the most frequently occurred character in the second code table, a code in which the head bit of the code made corresponding to the character in the second table is substituted into "11".

10. A data restoring apparatus comprising:

code table storing means for storing a plurality of code tables, in which characters are made corresponding to codes, each related to a different context;

determining data storing means for storing plural pieces of determining data while being related to the contexts;

context specifying means for specifying a context used for decoding the code;

determining means for determining whether an occurrence probability of a most frequently occurred character defined as a character to which a 1-bit code is made corresponding in the code table related to a context specified by said context specifying means on the basis of determining data stored in said determining data storing means with respect to the specified context, exceeds 50% or not;

character outputting means for, when said determining means determines that the occurrence probability of the most frequently occurred character does not exceed 50%, outputting a character made corresponding to the code that should be decoded in the code table relative to the context specified by said context specifying means that is stored in said code table storing means;

extension code table creating means for, when said determining means determines that the occurrence probability of the most frequently occurred character exceeds 50%, setting one code table stored in said code table storing means as a first code table, and creating an extension code table structured such that the codes are made corresponding to a character string in which each character within the first code table is subsequent to the most frequently occurred character in a second code table and to each character excluding the most frequently occurred character in the second code table on the basis of the first code table and the second code table for the context specified by said context specifying means;

character/character string outputting means for outputting a character or a character string made corresponding to the code that should be decoded in the extension code table created by said extension code table creating means; and updating means for, when said character outputting means or said character/character string outputting means outputs the character or the character string, updating a content of the determining data, related to the context specified by said context specifying means, in said determining data storing means, depending on whether or not the above character or the head character of the character string is coincident with the most frequently occurred character in the code table for the context specified by said context specifying means.

11. A data restoring apparatus according to claim 10, wherein said determining data storing means is stored with the determining data defined as numerical value data, said determining means, if the determining data is larger than a predetermined fiducial value, determines that the occurrence probability of the most frequently occurred character exceeds 50%, and said updating means, if the outputted character or the head character of the outputted character string is coincident with the most frequently occurred character, adds a predetermined value to the determining data and, in cases other than the above-mentioned, subtracts the predetermined value from the determining data.

12. A data restoring apparatus according to claim 10, wherein said determining data storing means is constructed of a plurality of shift registers each related to the context, said determining means, if said shift register corresponding to the context specified by said context specifying means contains "1" the number of which is larger than the predetermined fiducial value, determines that the occurrence probability of the most frequently occurred character exceeds 50%, and said updating means, if the outputted character or the head character of the outputted character string is coincident with the most frequently occurred character, inputs "1", from one end thereof, to said shift register corresponding to the context specified by said context specifying means, shifts, by one bit, a content of said shift register toward the other end thereof, and, in cases other than the above-mentioned, inputs "0", from the other end thereof, to said shift register corresponding to the context specified by said context specifying means and shifts, by one bit, the content of said shift register toward one end thereof.

13. A recording medium for recording programs for making a computer function as:

code table storing means for storing a plurality of code tables, in which characters are made corresponding to codes, each related to a different context;

obtaining means for obtaining a coding target character to be coded, from a character string that should be compressed;

context specifying means for specifying a context occurred just anterior to the coding target character obtained by said obtaining means;

first coding means for, if the code table stored ins aid code table storing means with respect to a context specified by said context specifying means is a code table containing a character an occurrence probability of which exceeds 50%, creating an extension code table in which the codes are made corresponding to a character string consisting of two characters starting with the character with its occurrence probability of over 50% and a character excluding the character with its occurrence probability of over 50% by modifying the code table, and coding the character string consisting of the coding target character, or the coding target character and a character next thereto, by use of the created extension code table; and second coding means for, if the code table stored ins aid code table storing means with respect to the context specified by said context specifying means is the code table containing no character with its occurrence probability of over 50%, coding the coding target character by use of this code table.

14. A recording medium for recording programs for making a computer function as:

code table storing means for storing a plurality of code tables, in which characters are made corresponding to codes, each related to a different context;

context specifying means for specifying a context used for decoding the code;

first decoding means for, if the code table stored in said code table storing means with respect to the context specified by said context specifying means is a code table comprising a character having an occurrence probability exceeding 50%, modifying the code table to create an extension code table in which codes are made corresponding to a character string comprising two characters starting from the character having an occurrence probability of over 50% and the character having an occurrence probability not exceeding 50%, and decoding the appropriate code by use of the extension code table; and second decoding means for, if the code table stored in said code table storing means with respect to the context specified by said context specifying means is a code table not having a character with an occurrence probability of over 50%, decoding the appropriate code by use of the code table.

15. A computer-readable medium having stored thereon a plurality of sequences of instructions, the plurality of sequences of instructions including sequences of instructions which, when executed by a processor, cause the processor to perform the steps of:

storing a plurality of code tables in which characters are made corresponding to codes, each code related to a different context;

specifying a context used for decoding the code;

modifying the code table to create an extension code table in which codes are made corresponding to a character string comprising first and second characters, the first character having an occurrence probability exceeding 50% and the second character having an occurrence probability not exceeding 50%, if the code table stored in the medium related to the context specified by the specifying step comprises a character having an occurrence probability exceeding 50%, and decoding the code by use of the extension code table; and decoding the code if the code table stored in the medium related to the context specified by the specifying step does not include a character having an occurrence probability exceeding 50%.

* * * * *

UNITED STATES PATENT AND TRADEMARK OFFICE
CERTIFICATE OF CORRECTION

PATENT NO. : 5,812,076
DATED : September 22, 1998
INVENTOR(S) :
  Yoshida

It is certified that error appears in the above-identified patent and that said Letters Patent is hereby corrected as shown below:

Col. 14, line 29, change "{10,11}" to --{0,10,11}--.

Col. 15, line 54, change "cod e" to --code--.

Col. 17, line 18, change "a nd" to --and--.

Signed and Sealed this

Sixth Day of April, 1999

Attest:

Q. TODD DICKINSON

Attesting Officer        Acting Commissioner of Patents and Trademarks